(12) United States Patent
Downs et al.

(10) Patent No.: US 12,394,694 B2
(45) Date of Patent: Aug. 19, 2025

(54) INTEGRATED POWER SWITCHING DEVICE HEAT SINK

(71) Applicant: AMERICAN AXLE & MANUFACTURING, INC., Detroit, MI (US)

(72) Inventors: James P. Downs, South Lyon, MI (US); Paul J. Valente, Berkley, MI (US); Chi-Wai David Lau, LaSalle (CA)

(73) Assignee: AMERICAN AXLE & MANUFACTURING, INC., Detroit, MI (US)

( * ) Notice: Subject to any disclaimer, the term of this patent is extended or adjusted under 35 U.S.C. 154(b) by 477 days.

(21) Appl. No.: 17/973,219

(22) Filed: Oct. 25, 2022

(65) Prior Publication Data

US 2023/0041227 A1 Feb. 9, 2023

Related U.S. Application Data

(63) Continuation of application No. 17/503,433, filed on Oct. 18, 2021, now Pat. No. 12,199,020, which is a
(Continued)

(51) Int. Cl.
H01L 23/495 (2006.01)
H02K 1/16 (2006.01)
(Continued)

(52) U.S. Cl.
CPC ......... *H01L 23/49568* (2013.01); *H02K 1/16* (2013.01); *H02K 1/20* (2013.01);
(Continued)

(58) Field of Classification Search
CPC ........... H01L 23/3726; H01L 23/49513; H01L 23/49562; H01L 23/49568; H01L 24/48;
(Continued)

(56) References Cited

U.S. PATENT DOCUMENTS 5,587,882 A 12/1996 Patel
6,081,027 A 6/2000 Akram
(Continued)

FOREIGN PATENT DOCUMENTS

CN 101496261 A 7/2009
CN 104080312 A 10/2014
(Continued)

OTHER PUBLICATIONS

Korean Office Action for Korean Patent Application No. 10-2025-7000021 dated Jan. 23, 2025 (7 pages).
(Continued)

*Primary Examiner* — Hoai V Pham
(74) *Attorney, Agent, or Firm* — DICKINSON WRIGHT PLLC

(57) ABSTRACT

An electrical assembly that with an inverter that is mounted to the field windings of a stator. The inverter has a plurality of power semiconductor packages (PSP), each of which including a semiconductor die, a plurality of electric terminals, which are electrically coupled to the semiconductor die, and a heat sink with a base, which is fixedly and electrically coupled to one of the electric terminals, and a plurality of fins that extend axially from the base in a direction away from the semiconductor die. The PSP's are arranged in a circumferentially spaced apart manner. The fins are arranged in rows and are progressively longer in length from a radially-inner most fin to a radially-outer most fin. Slots are formed in the base on a radially-inner side of the base. Each slot extends toward a radially-outer side of the base and intersects a corresponding one of the rows of fins.

10 Claims, 33 Drawing Sheets

Related U.S. Application Data continuation-in-part of application No. PCT/US2020/029925, filed on Apr. 24, 2020.

(60) Provisional application No. 62/904,199, filed on Sep. 23, 2019, provisional application No. 62/838,893, filed on Apr. 25, 2019, provisional application No. 63/263,830, filed on Nov. 10, 2021.

(51) Int. Cl.

| | |
|---|---|
| *H02K 1/20* | (2006.01) |
| *H02K 5/15* | (2006.01) |
| *H02K 5/20* | (2006.01) |
| *H02K 5/22* | (2006.01) |
| *H02K 7/116* | (2006.01) |
| *H02K 9/19* | (2006.01) |
| *H02K 9/22* | (2006.01) |
| *H02K 11/00* | (2016.01) |
| *H02K 11/27* | (2016.01) |
| *H02K 11/33* | (2016.01) |
| *H01L 23/00* | (2006.01) |
| *H01L 23/373* | (2006.01) |

(52) U.S. Cl.
CPC .............. *H02K 5/15* (2013.01); *H02K 5/203* (2021.01); *H02K 5/225* (2013.01); *H02K 7/116* (2013.01); *H02K 9/19* (2013.01); *H02K 9/227* (2021.01); *H02K 11/00* (2013.01); *H02K 11/27* (2016.01); *H02K 11/33* (2016.01); *H01L 23/3736* (2013.01); *H01L 23/49513* (2013.01); *H01L 23/49562* (2013.01); *H01L 24/48* (2013.01); *H01L 24/73* (2013.01); *H01L 24/92* (2013.01); *H01L 2224/48175* (2013.01); *H01L 2224/73265* (2013.01); *H01L 2224/92247* (2013.01); *H01L 2924/13091* (2013.01); *H02K 2211/03* (2013.01)

(58) Field of Classification Search
CPC .............. H01L 24/73; H01L 24/92; H01L 2224/48175; H01L 2224/73265; H01L 2224/92247; H01L 2224/13091
USPC .................................................. 257/675, 718
See application file for complete search history.

(56) References Cited

U.S. PATENT DOCUMENTS

| | | | |
|---|---|---|---|
| 6,404,065 B1 | 6/2002 | Choi | |
| 6,930,417 B2 | 8/2005 | Kaneko et al. | |
| 7,525,224 B2 | 4/2009 | Takenaka et al. | |
| 7,641,490 B2 | 1/2010 | Korich et al. | |
| 7,775,060 B2 | 8/2010 | Nakajima et al. | |
| 7,863,098 B2 | 1/2011 | Lange et al. | |
| 8,074,753 B2 | 12/2011 | Tahara et al. | |
| 8,937,414 B2 | 1/2015 | Song et al. | |
| 9,030,063 B2 | 5/2015 | Rawlinson et al. | |
| 9,692,277 B2 | 6/2017 | Pearce, Jr. et al. | |
| 10,236,791 B1 | 3/2019 | Chung et al. | |
| 10,332,822 B2 | 6/2019 | Bradfield | |
| 10,411,574 B2 | 9/2019 | Nakashima et al. | |
| 10,464,439 B2 | 11/2019 | Liu et al. | |
| 10,696,149 B2 | 6/2020 | Pearce, Jr. et al. | |
| 11,303,183 B2 | 4/2022 | Downs et al. | |
| 2005/0104027 A1 | 5/2005 | Lazarev | |
| 2005/0211490 A1 | 9/2005 | Shimizu et al. | |
| 2008/0128896 A1 | 6/2008 | Toh et al. | |
| 2012/0098391 A1 | 4/2012 | Yamasaki et al. | |
| 2013/0076174 A1 | 3/2013 | Wibben et al. | |
| 2013/0278090 A1 | 10/2013 | Matsuo | |
| 2013/0285485 A1 | 10/2013 | Song et al. | |
| 2014/0265659 A1 | 9/2014 | Chamberlin et al. | |
| 2016/0105081 A1 | 4/2016 | Bradfield | |
| 2016/0172939 A1 | 6/2016 | Owen | |
| 2016/0276895 A1 | 9/2016 | Aizawa et al. | |
| 2016/0285335 A1 | 9/2016 | Watanabe et al. | |
| 2017/0077779 A1 | 3/2017 | Hanioka et al. | |
| 2017/0117208 A1 | 4/2017 | Kasztelan et al. | |
| 2017/0331356 A1 | 11/2017 | Nakashima | |
| 2017/0365536 A1 | 12/2017 | Amo et al. | |
| 2018/0058773 A1 | 3/2018 | Adhiachari et al. | |
| 2018/0211938 A1* | 7/2018 | Tsuyuno ................ H01L 25/18 | |
| 2018/0218960 A1 | 8/2018 | Takahagi et al. | |
| 2019/0067154 A1 | 2/2019 | Yoshihara et al. | |
| 2020/0149624 A1 | 5/2020 | Hata et al. | |
| 2020/0227334 A1 | 7/2020 | Hart et al. | |
| 2020/0331343 A1 | 10/2020 | Takahashi et al. | |
| 2021/0066157 A1 | 3/2021 | Manninen et al. | |
| 2022/0037954 A1 | 2/2022 | Downs et al. | |

FOREIGN PATENT DOCUMENTS

| | | |
|---|---|---|
| CN | 106796928 A | 5/2017 |
| CN | 107769587 A | 3/2018 |
| CN | 108599470 | 9/2018 |
| CN | 108630643 A | 10/2018 |
| DE | 102013214899 | 2/2015 |
| DE | 102015216055 | 2/2017 |
| DE | 102017214490 | 2/2019 |
| DE | 102018111624 | 11/2019 |
| GB | 2574018 | 11/2019 |
| GB | 2574019 | 11/2019 |
| GB | 2574020 | 11/2019 |
| JP | H09129791 | 5/1997 |
| JP | 2001060750 | 3/2001 |
| JP | 2002289771 A | 10/2002 |
| JP | 2008131686 A | 6/2008 |
| JP | 2008184111 | 8/2008 |
| JP | 2012074440 | 4/2012 |
| JP | 2016144382 | 8/2016 |
| KR | 1020140057032 | 5/2014 |
| WO | WO1996019827 | 6/1996 |
| WO | WO2018030343 | 2/2018 |
| WO | WO2018138530 | 8/2018 |
| WO | WO2019208081 | 10/2019 |
| WO | WO2019208083 | 10/2019 |
| WO | WO2019208084 | 10/2019 |
| WO | WO2020219955 | 10/2020 |

OTHER PUBLICATIONS

English Translation of Korean Office Action for Korean Patent Application No. 10-2025-7000021 dated Jan. 23, 2025 (6 pages).
European Search Report for corresponding European application EP20795936.2, filed Nov. 25, 2021.
European Search Report for corresponding European application EP22202238.6, filed Oct. 18, 2022.
Written Opinion and International Search Report for International Application PCT/US2020/029925, mailed Sep. 21, 2020.
On Semiconductor®, NTB5860NL, NTP5860NL, NVB5860NL, N-Channel Power MOSFET Information pages, Semiconductor Components Industries, LLC, Aug. 2012, 9 pages.
Chinese Office Action for Chinese Patent Application No. 202080031188.X dated Nov. 23, 2023 (6 pages).

\* cited by examiner

INTEGRATED POWER SWITCHING DEVICE HEAT SINK

CROSS-REFERENCE TO RELATED APPLICATIONS

This application is a continuation of U.S. application Ser. No. 17/503,433 filed Oct. 18, 2021, which is a continuation-in-part application of International Application No. PCT/US2020/029925 filed Apr. 24, 2020, which claims the benefit of U.S. Provisional Application U.S. Provisional Application No. 62/904,199 filed Sep. 23, 2019 and No. 62/838,893 filed Apr. 25, 2019. This application also claims the benefit of U.S. Provisional Application No. 63/263,830 filed Nov. 10, 2021. The disclosure of each of the above-identified application is incorporated by reference as fully set forth in detail herein.

FIELD

The present disclosure relates to an electrical assembly having a heat sink that is unitarily and integrally formed with a lead of a power semiconductor.

BACKGROUND

This section provides background information related to the present disclosure which is not necessarily prior art.

While there is increasing interest in the electrification of vehicle drivelines, there are significant issues that must be overcome before vehicles with electrified drivelines substantially displace vehicle drivelines that are powered solely by internal combustion engines. Some of these issues include the cost of the electrified driveline, the volume of the electrified driveline and its ability to be packaged into available space within a vehicle, as well as the robustness of the electronics that are employed to operate and control the electrified driveline.

SUMMARY

This section provides a general summary of the disclosure, and is not a comprehensive disclosure of its full scope or all of its features.

In one form, the present disclosure provides an electrical assembly that includes a semiconductor die, a plurality of electrically conductive leads, a heat sink and a case. The semiconductor die includes a power semiconductor device having a plurality of terminals. Each of the electrically conductive leads is electrically coupled to an associated one of the terminals on the power semiconductor device. The heat sink is formed of an electrically and thermally conductive material and includes a base, a mount, and a plurality of fins. The mount extends from a first side of the base and is coupled to the semiconductor die. The fins are fixedly coupled to the base and extend from a second side of the base that is opposite the first side of the base. The case is formed of a first electrically insulating material. A first one of the plurality of leads is integrally and unitarily formed with the mount.

In one form, each of the leads that is not unitarily and integrally formed with the mount is electrically coupled to its associated one of the terminals via a bond wire. In one form, the semiconductor die is coupled to the mount using at least one of a solder material and a sinter material. In one form, the plurality of fins are unitarily and integrally formed with the base. In one form, the electrically and thermally conductive material from which the heat sink is formed comprises at least one of copper and aluminum. In one form, the base and the mount are integrally formed. In one form, the power semiconductor device comprises a field effect transistor. In one form, the field effect transistor is a metal oxide silicone field effect transistor. In one form, at least a portion of each of the plurality of fins has a cuboid shape. In one form, at least a portion of each of the plurality of fins has a rod-like shape. In one form, the plurality of fins are orthogonal to the leads. In one form, the base of the heat sink has a first side that has a corrugated shape and a second side opposite the first side, where the second side has a linear shape. In one form, a length of the plurality of fins increases from a first edge of the heat sink to a second edge of the heat sink. In one form, the electrical assembly further includes an inverter mount and a plurality of bus bars, the inverter mount being formed of a second electrically insulating material and defining a mounting flange, where a portion of the electrically conductive leads are received through the mounting flange and are electrically and mechanically coupled to associated ones of the bus bars. In one form, the electrical assembly includes a stator, the stator having a motor winding, and wherein the heat sink is electrically coupled to the motor winding.

In one form, the present disclosure provides a method for fabricating a semiconductor package that includes a plurality of leads. The method includes: providing a heat sink that is formed of an electrically and thermally conductive material, the heat sink having a base, a mount, and a plurality of fins, where the mount extends from a first side of the base, the plurality of fins are fixedly coupled to the base and extend from a second side of the base that is opposite the first side of the base, and where a first one of the plurality of leads is integrally and unitarily formed with the mount; attaching a semiconductor die that includes a power semiconductor device to the mount of the heat sink, the power semiconductor device having a plurality of terminals; coupling each of the leads that is not unitarily and integrally formed with the mount to its associated one of the terminals via a bond wire; and encapsulating the semiconductor die and the mount with a case formed of a first electrically insulating material.

In another form, the present disclosure provides an electrical assembly that includes a stator and an inverter. The stator has a plurality of field windings, each of which having a phase lead. The inverter has an inverter mount and a plurality of power semiconductor packages. The inverter mount has an annular mounting flange and a plurality of phase lead bosses that are coupled to the annular mounting flange. Each of the phase leads is received through a corresponding one of the phase lead bosses. Each of the power semiconductor packages has a semiconductor die, a plurality of electric terminals, and a heat sink. Each of the electric terminals is electrically coupled to the semiconductor die. The heat sink has a base, which is fixedly and electrically coupled to one of the electric terminals, and a plurality of fins that extend axially from the base in a direction away from the semiconductor die. Each of the power semiconductor packages is mounted to the inverter mount such that at least a portion of the electric terminals of each of the power semiconductor packages extends through the mounting flange. The power semiconductor packages are arranged in a circumferential spaced apart manner. The fins of each heat sink are arranged in rows and the fins in each row taper such that a radially-inner most fins in each of the rows is shorter than a radially-outer most fin in each of the rows. A plurality of slots are formed in the base on a radially-inner side of the base. Each of the slots extend toward a radially-outer side of the base and intersect a corresponding one of the rows of fins.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
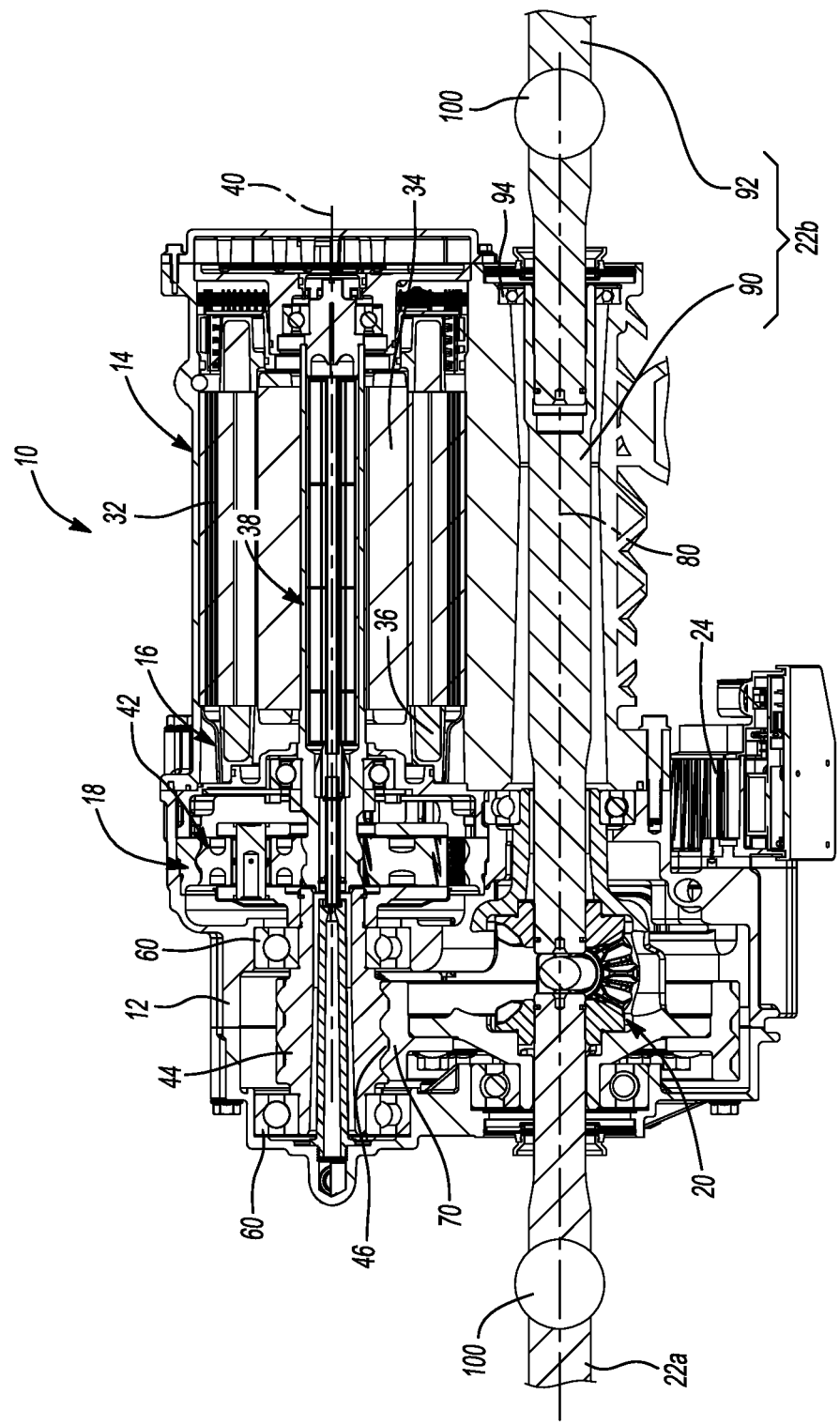
FIGS. 1 and 2 are longitudinal section views of an exemplary electric drive module constructed in accordance with the teachings of the present disclosure.
Figure 2:
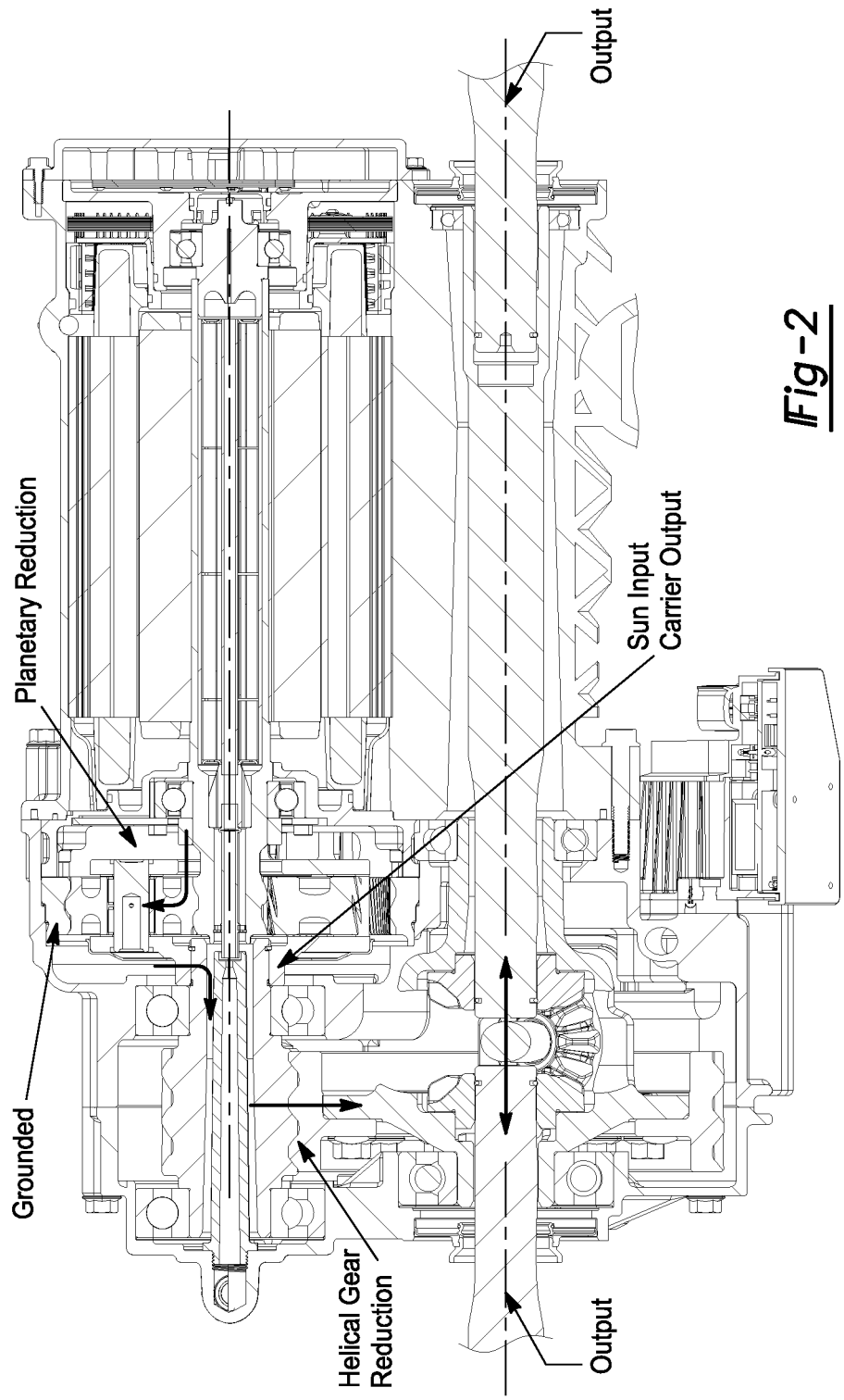
Figure 5:
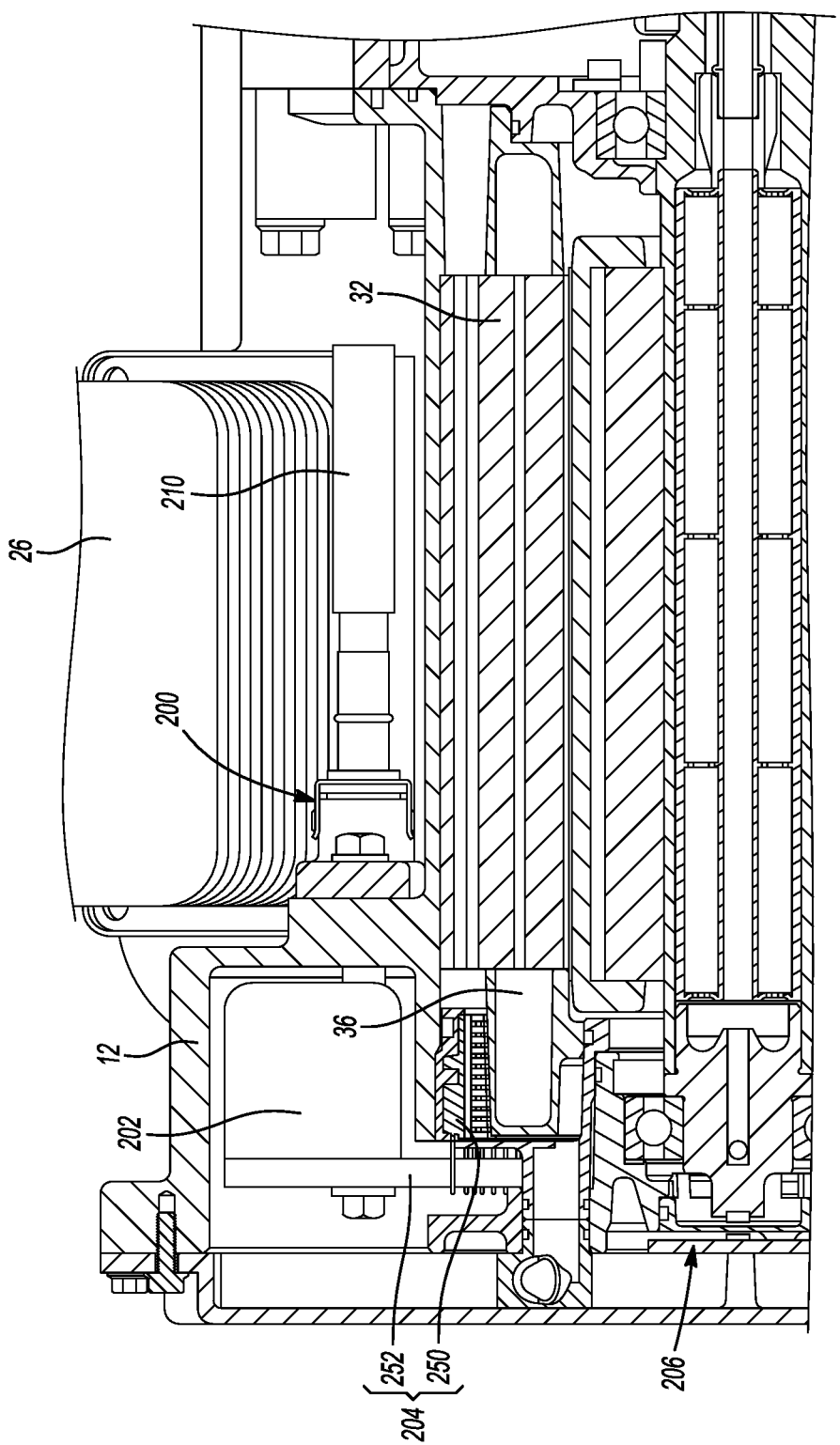
FIGS. 5 and 6 are partly sectioned views of the electric drive unit of FIG. 1.
Figure 6:
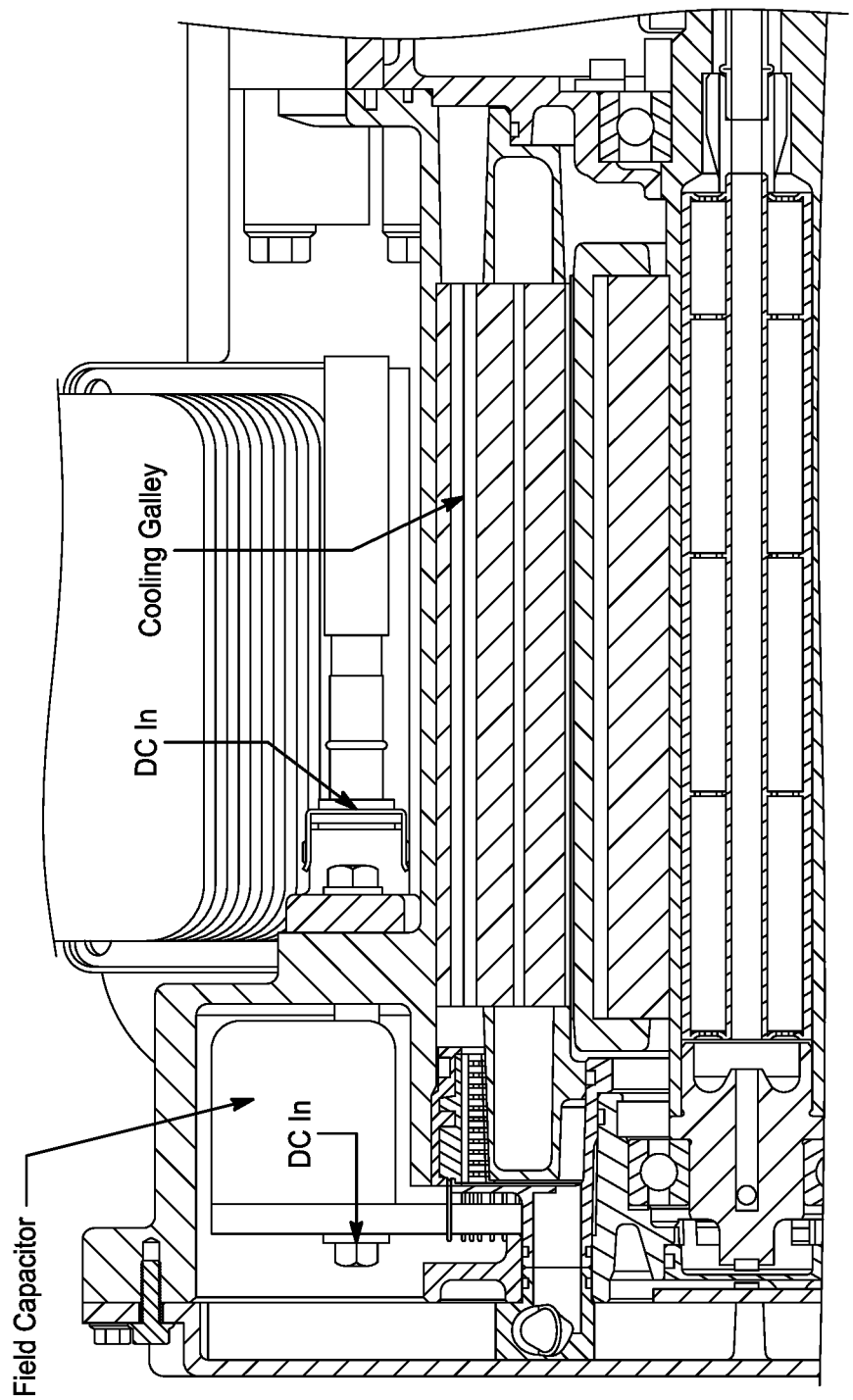

With reference to FIGS. 1 and 2, an exemplary electric drive module constructed in accordance with the teachings of the present disclosure is generally indicated by reference numeral 10. The electric drive module 10 includes a housing assembly 12, an electric motor 14, a control unit 16, a transmission 18, a differential assembly 20, a pair of output shafts 22a and 22b, a pump 24, a heat exchanger 26 (FIG. 5) and a filter 28.

The housing assembly 12 can house the motor 14, the control unit 16, the transmission and the differential assembly 20. The electric motor 14 can be any type of electric motor and can have a stator 32 and a rotor 34. The stator 32 can include field windings 36, whereas the rotor 34 can include a rotor shaft 38 that can be disposed within the stator 32 for rotation about a first rotational axis 40.

The transmission 18 can include a planetary reduction 42, a shaft 44 and a transmission output gear 46. The planetary reduction can have a sun gear, which can be unitarily and integrally formed with the rotor shaft 38 to keep pitch line velocity as low as possible, a ring gear, which can be grounded to or non-rotatably coupled to the housing assembly 12, a planet carrier and a plurality of planet gears that can be journally supported by the planet carrier and which can be meshingly engaged with both the sun gear and the ring gear. The sun gear, the ring gear and the planet gears can be helical gears. The shaft 44 can be mounted to a set of bearings 60 that support the shaft for rotation about the first rotational axis 40 relative to the housing assembly 12. The transmission output gear 46 can be coupled to (e.g., unitarily and integrally formed with) the shaft 44 for rotation therewith about the first rotational axis 40.

The differential assembly 20 can include a final drive or differential input gear 70 and a differential. The differential input gear 70 can be rotatable about a second rotational axis 80 and can be meshingly engaged to the transmission output gear 46. In the example provided, the transmission output gear 46 and the differential input gear 70 are helical gears. The differential can be any type of differential mechanism that can provide rotary power to the output shafts 22a and 22b while permitting (at least in one mode of operation) speed differentiation between the output shafts 22a and 22b. In the example provided, the differential includes a differential case, which is coupled to the differential input gear 70 for rotation therewith, and a differential gearset having a plurality of differential pinions, which are coupled to the differential case and rotatable (relative to the differential case) about one or more pinion axes that are perpendicular to the second rotational axis 80, and a pair of side gears that are meshingly engaged with the differential pinions and rotatable about the second rotational axis 80. Each of the output shafts 22a and 22b can be coupled to an associated one of the side gears for rotation therewith. In the example provided, the output shaft 22b is formed as two distinct components: a stub shaft 90 and a half shaft 92. The stub shaft 90 is drivingly coupled to an associated one of the side gears and extends between an associated gear and the half shaft 92 and is supported by a bearing 94 in the housing assembly 12 for rotation about the second rotational axis 80. Each of the output shaft 22a and the half shaft 92 has a constant velocity joint 100 with a splined male stem. The splined male stem of the constant velocity joint on the output shaft 22a is received into and non-rotatably coupled to an associated one of the side gears. The splined male stem of the constant velocity joint on the half-shaft 92 is received into and non-rotatably coupled to the stub shaft 90.

In FIGS. 3 through 6, the control unit 16 includes a power terminal 200, one or more field capacitor 202, an inverter 204 and a controller 206. The power terminal 200 can be mounted to the housing assembly 12 and can have contacts or terminals (not shown) that can be fixedly coupled to a respective power lead 210 to electrically couple the power lead 210 to the control unit 16. It will be appreciated that the electric motor 14 can be powered by multi-phase electric AC power and as such, the power terminal 200 can have multiple contacts or terminals to permit the several power leads 210 to be coupled to the control unit 16.

Each field capacitor 202 electrically couples an associated one of the power leads 210 to the inverter 204. In the example provided, each field capacitor 202 is relatively small and is disposed in an annular space between the inverter 204 and the housing assembly 12. The annular space can be disposed adjacent to an end of a body of the stator 32 from which the field windings 36 extend. Each field capacitor 202 can be mounted to the inverter 204.

With reference to FIGS. 3, 4 and 7 through 15, the inverter 204 can be an annular structure that can be mounted about the field windings 36 that extend from the body of the stator 32. In the example provided, the inverter 204 includes a power semiconductor assembly 250 and a circuit board assembly 252. The power semiconductor assembly 250 can comprise a plurality of power semiconductor packages 262 and an inverter mount 264.

The power semiconductor package 262 has a semiconductor die 266 that includes a power semiconductor device 268. The power semiconductor device 268 can be any suitable power semiconductor device, such as an insulated gate bipolar transistor (IGBT). In the example provided, the power semiconductor device is a field effect transistor 269, which may be a metal oxide silicon field effect transistor (MOSFET), or a junction field effect transistor (JFET). The power semiconductor package 262 has a plurality of terminals 270 and a plurality of electrically conductive leads 272a, 272b, 272c, 272d (collectively referred to hereinafter as "electrically conductive leads 272"). Each of the electrically conductive leads 272 is electrically coupled to an associated one of the terminals 270.

The power semiconductor package 262 has a heat sink 274 that is formed of an electrically and thermally conductive material, such as copper or aluminum. The heat sink 274 has a base 276, a mount 278, and a plurality of fins 280. The mount 278 extends from a first side 276a of the base 276 and is coupled to the semiconductor die 266. The plurality of fins 280 are fixedly coupled to the base 276 and extend from a second side 276b of the base 276 that is opposite the first side 276a of the base 276. The base 276 and the mount 278 can be integrally and unitarily formed.

The power semiconductor package 262 has a case 281 having a first side 281a and a second side 281b that is opposite the first side 281a of the case 281. The case 281 is formed of a first electrically insulating material, such as a resin material. The semiconductor die 266 and the mount 278 are encapsulated in the case 281 during, for example, an overmolding process. The plurality of fins 280 extend from the second side 281b of the case 281.

Figure 7:
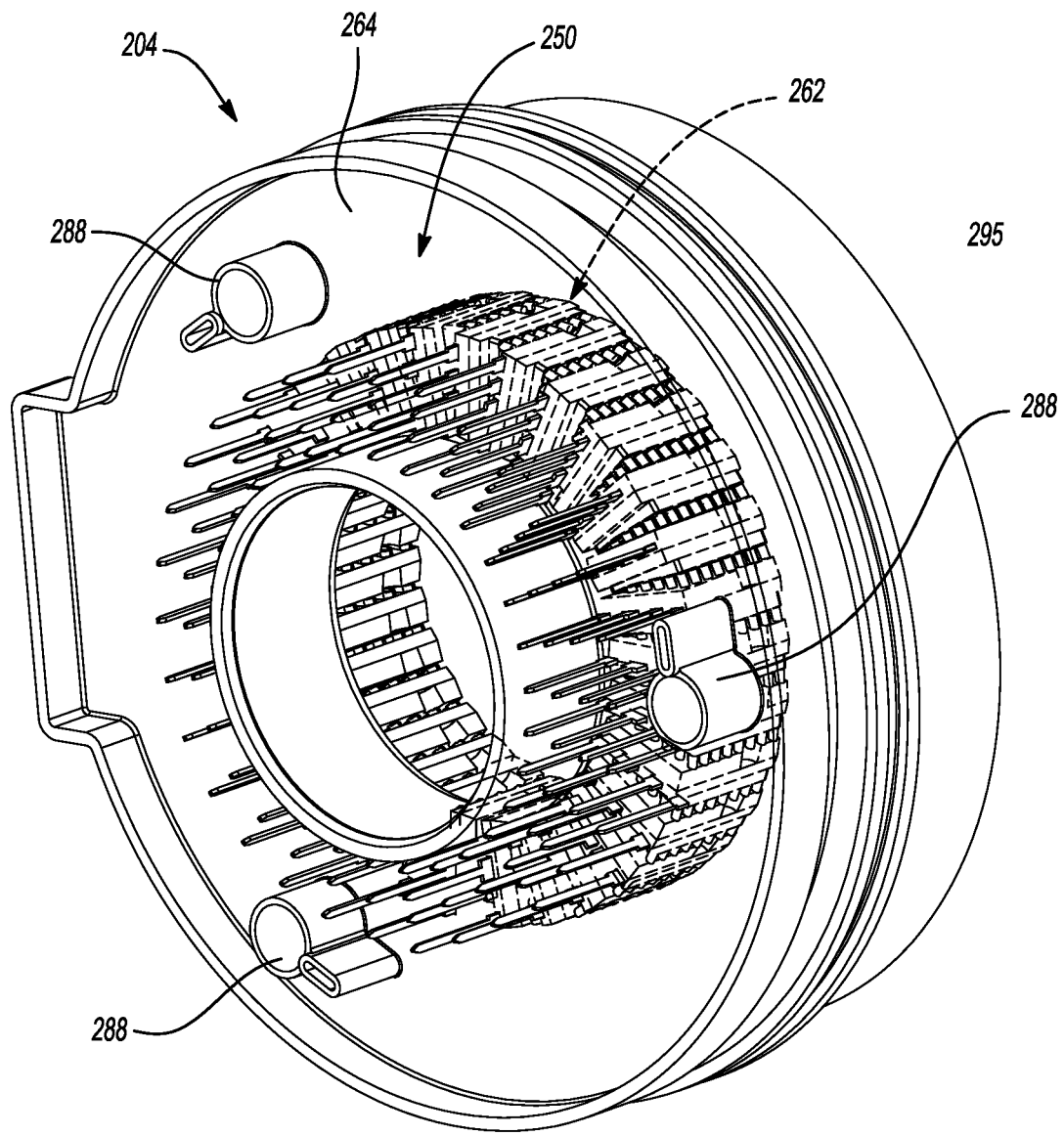
FIG. 7 is a perspective view of a portion of the motor assembly, illustrating a portion of an inverter in a see-through manner and in more detail.
Figure 8:
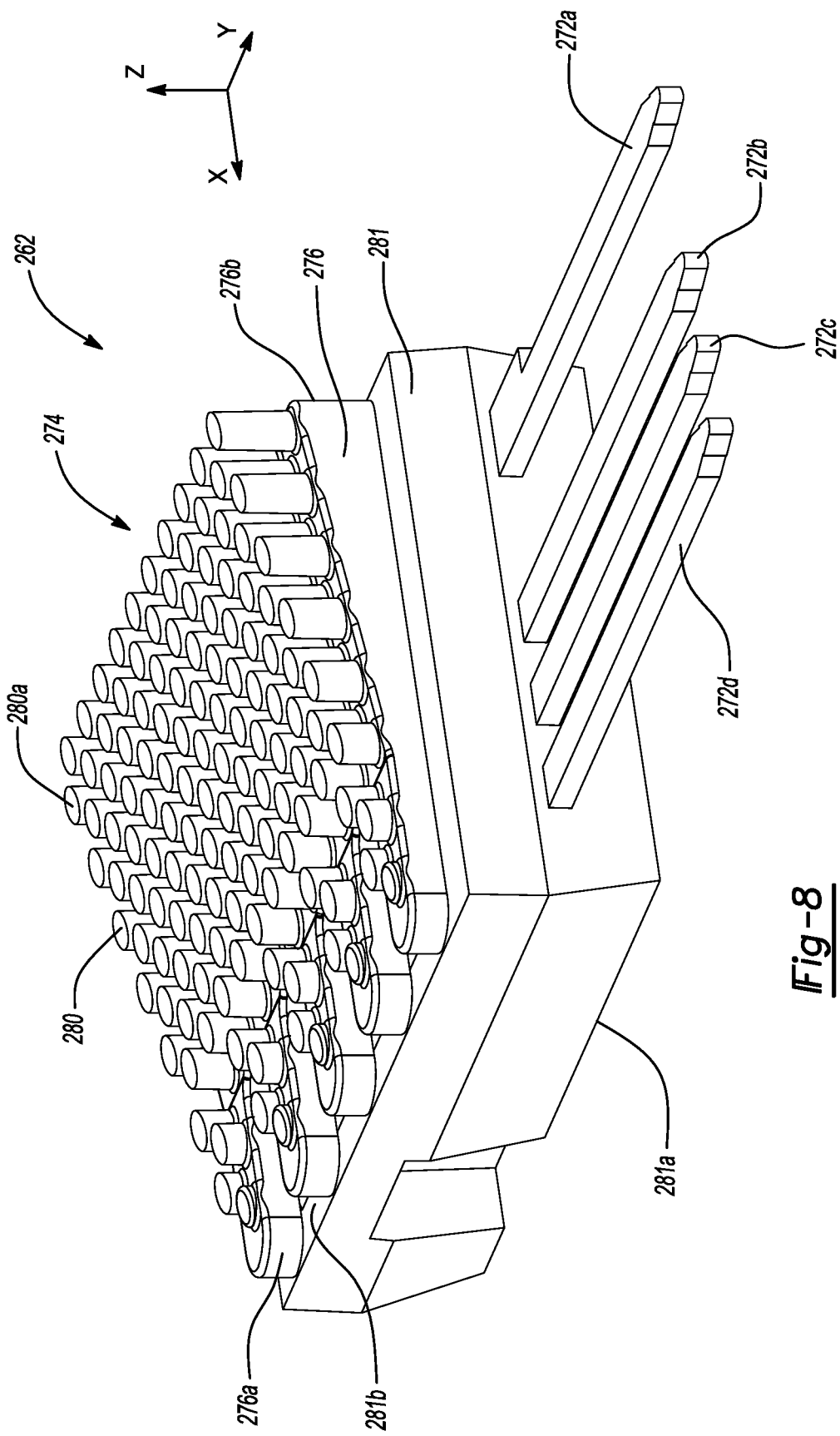
FIGS. 8 and 9 are perspective views of a power semiconductor package having a plurality of rod-shaped fins and cuboid-shaped fins, respectively.
Figure 9:
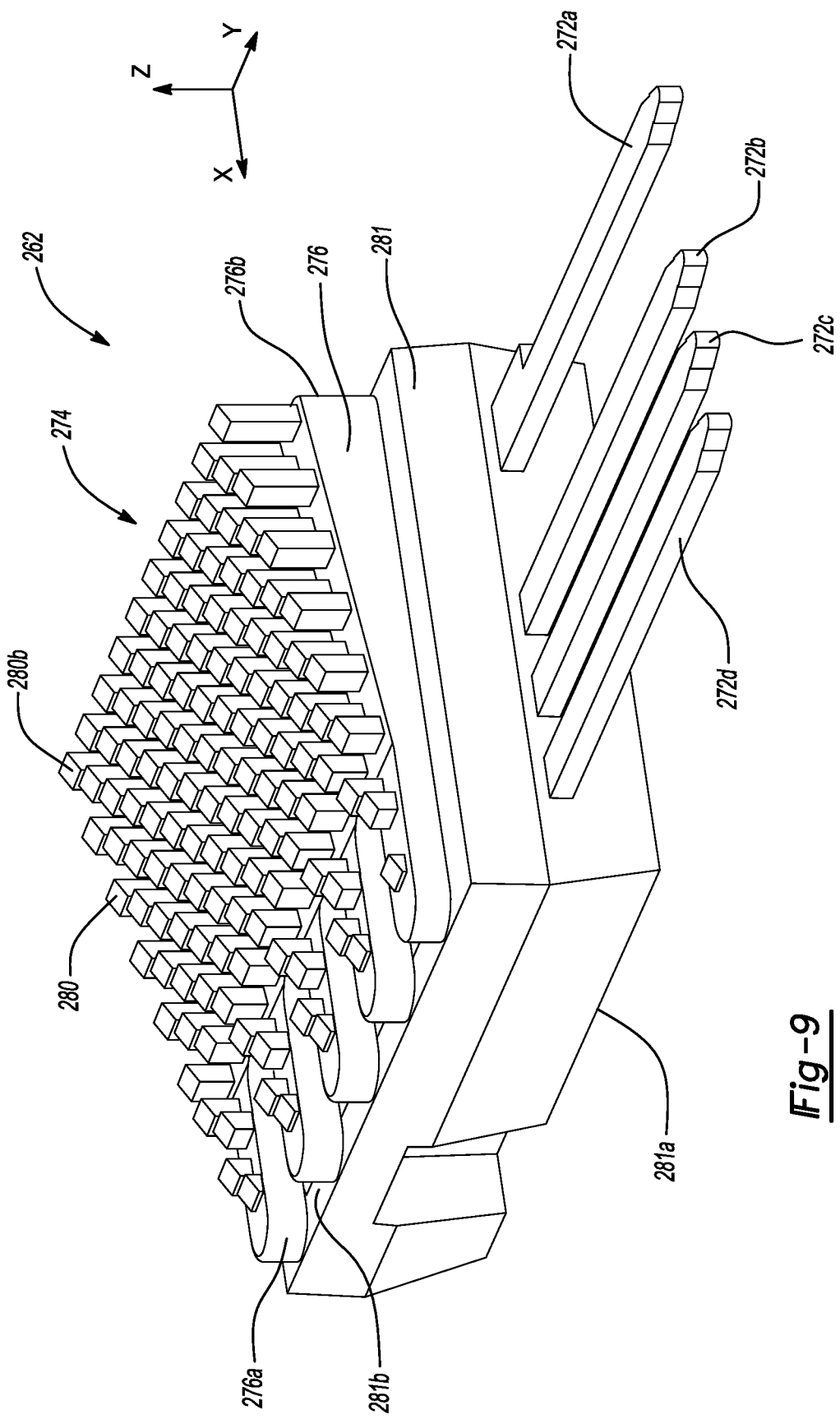
Figure 10:
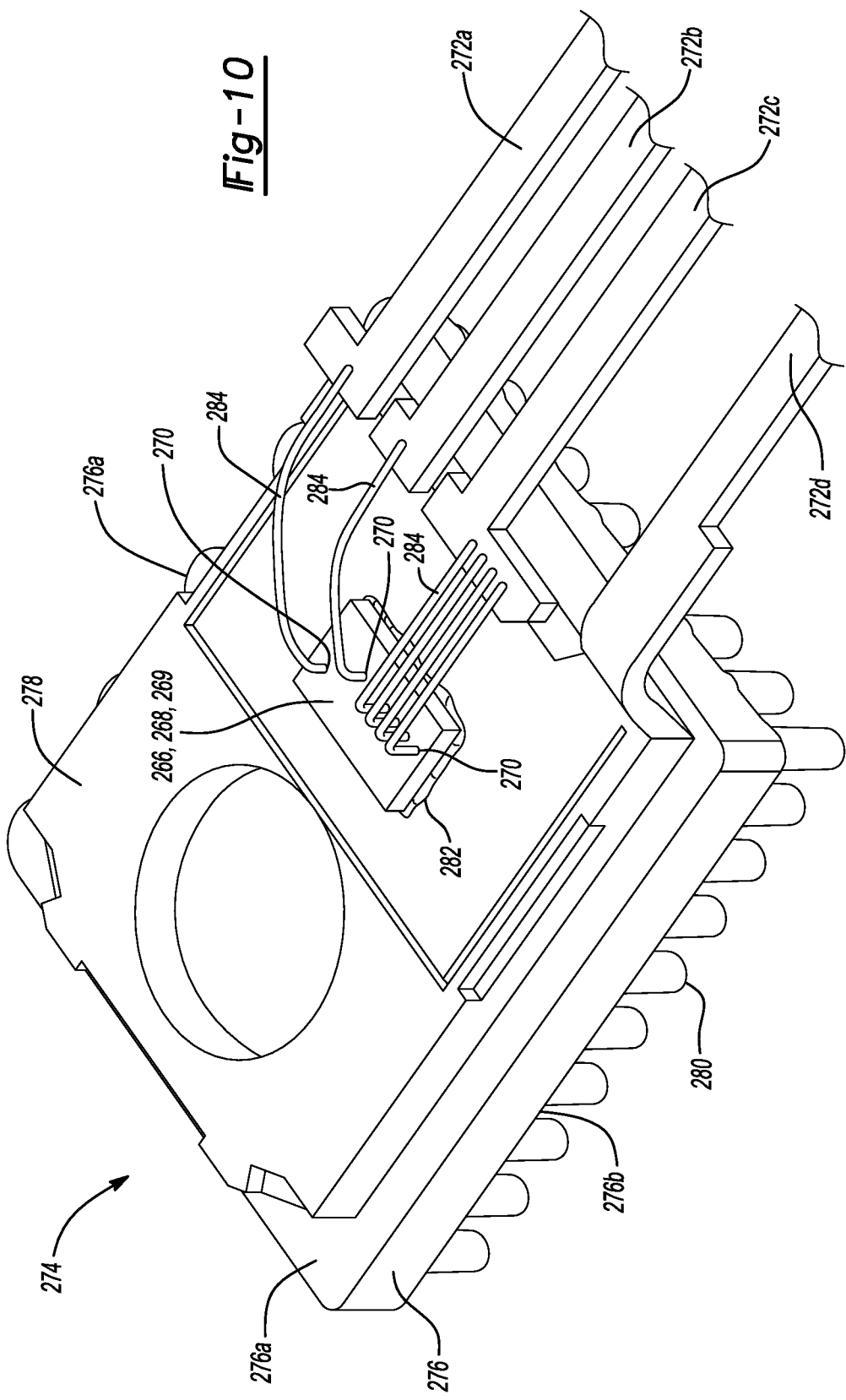
FIG. 10 is a perspective view of a power semiconductor package with a case thereof removed for clarity.

The plurality of fins 280 are fixedly coupled to (e.g., unitarily and integrally formed with) the base 276. The fins 280 can be disposed in any desired orientation, such as orthogonal to the electrically conductive leads 272. In one form, the first side 276a has a corrugated shape, and the second side 276b has a linear (or substantially linear) shape. It should be understood that the first side 276a and the second side 276b can have various shapes and are not limited to the examples described herein. The length of the base 276 can gradually (or nongradually) increase from the first side 276a to the second side 276b. Likewise, the length of the fins 280 can gradually (or nongradually) increase from the first side 276a to the second side 276b (i.e., along the x-axis). The power semiconductor packages 262 of the power semiconductor assembly 250 can be arranged in an annular manner as shown in FIG. 7. If desired, the fins 280 of a given power semiconductor package 262 contact a second side 281b of the case 281 of a circumferentially adjacent power semiconductor package 262.

Each of the fins 280 on each heat sink 274 can be shaped as desired. For example, some or all of the fins 280 can be shaped as rods, such as the fins 280a shown in FIG. 8, or could have a cuboid shape, such as the fins 280b shown in FIG. 9. It should be understood that the fins 280 may have other shapes in other forms and are not limited to the examples described herein.

The semiconductor die 266 is coupled to the mount 278 using a bonding material 282, which may be at least one of a solder material and a sinter material. One of the electrically conductive leads 272 (e.g., the electrically conductive lead 272a) is integrally and unitarily formed with the mount 278. The remaining electrically conductive leads 272 (e.g., electrically conductive leads 272b, 272c, 272d) that are not unitarily and integrally formed with the mount 278 are electrically coupled to an associated terminal 270 via a bond wire 284.

Figure 11:
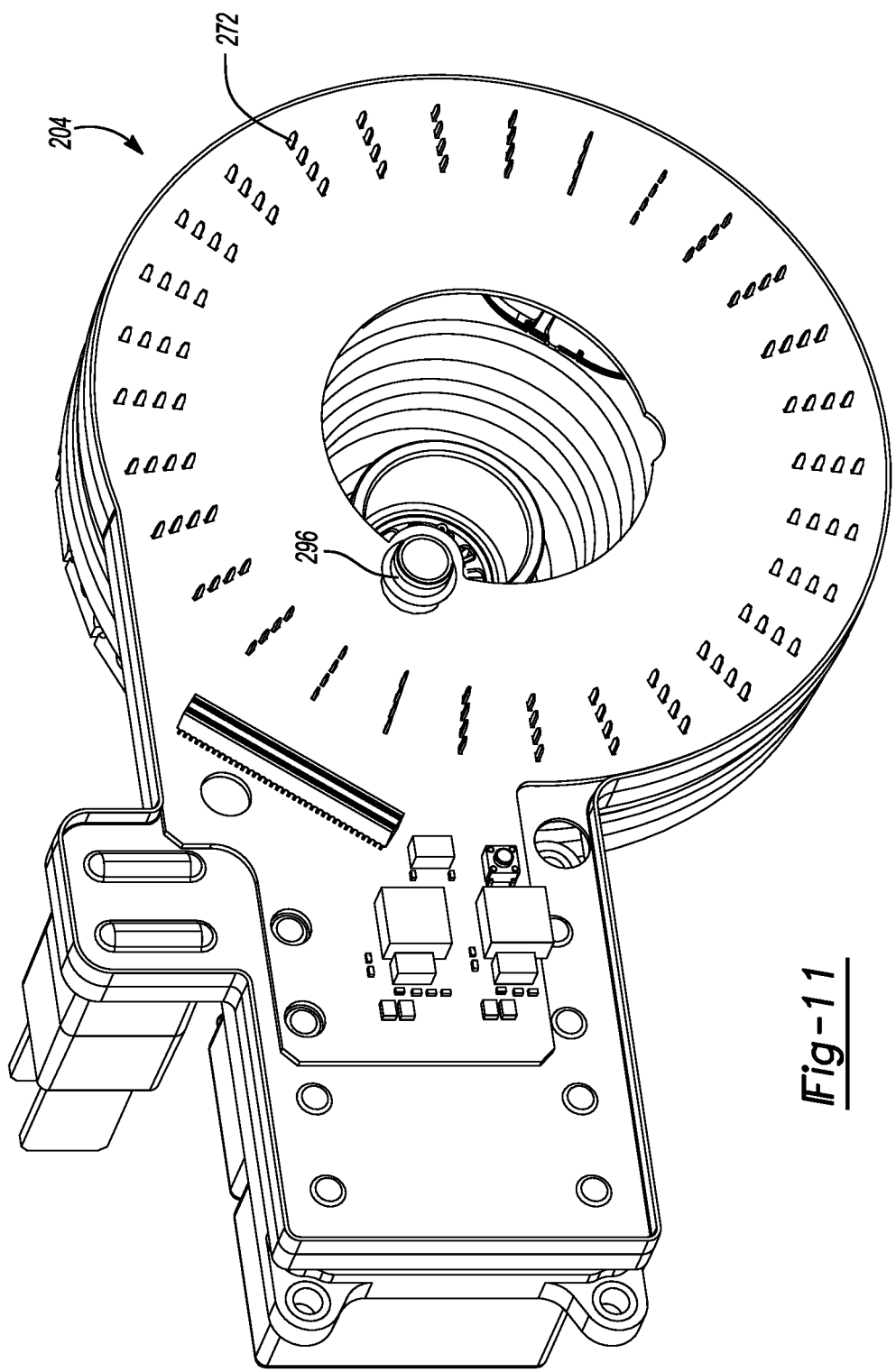
FIG. 11 is a perspective view of an inverter.
Figure 12:
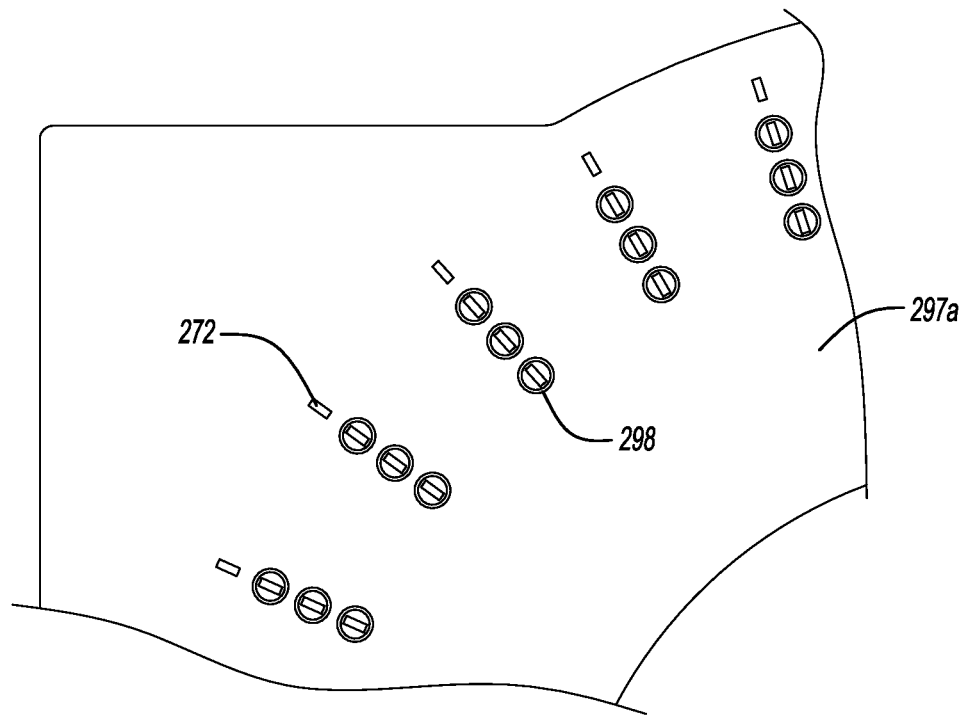
FIGS. 12 through 15 are partial cross-sectional views of a bulbar.
Figure 13:
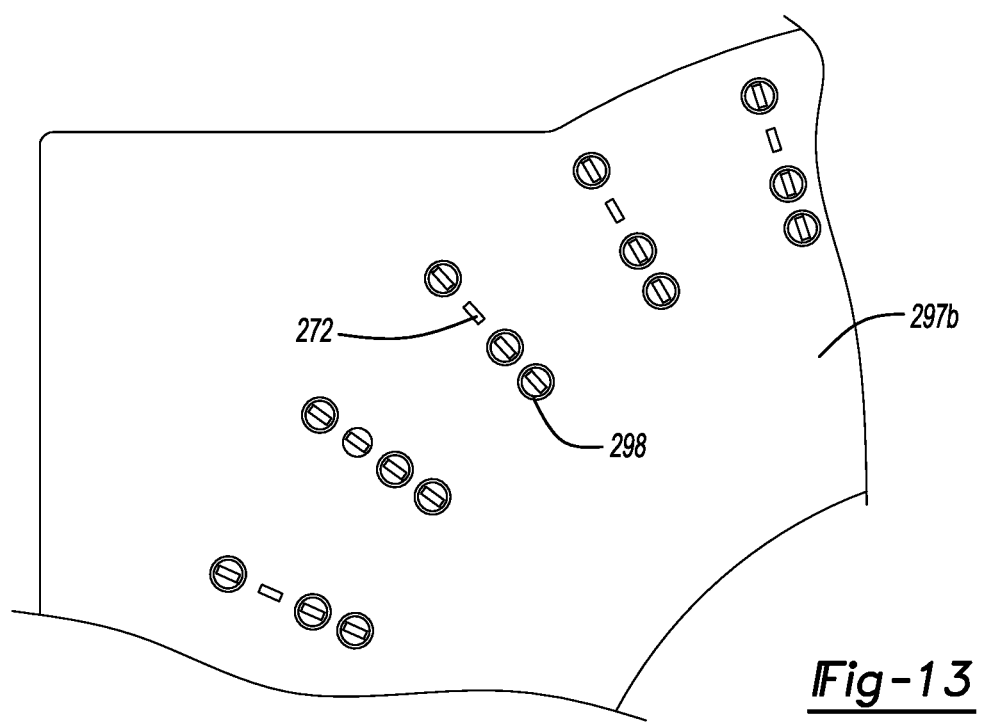
Figure 14:
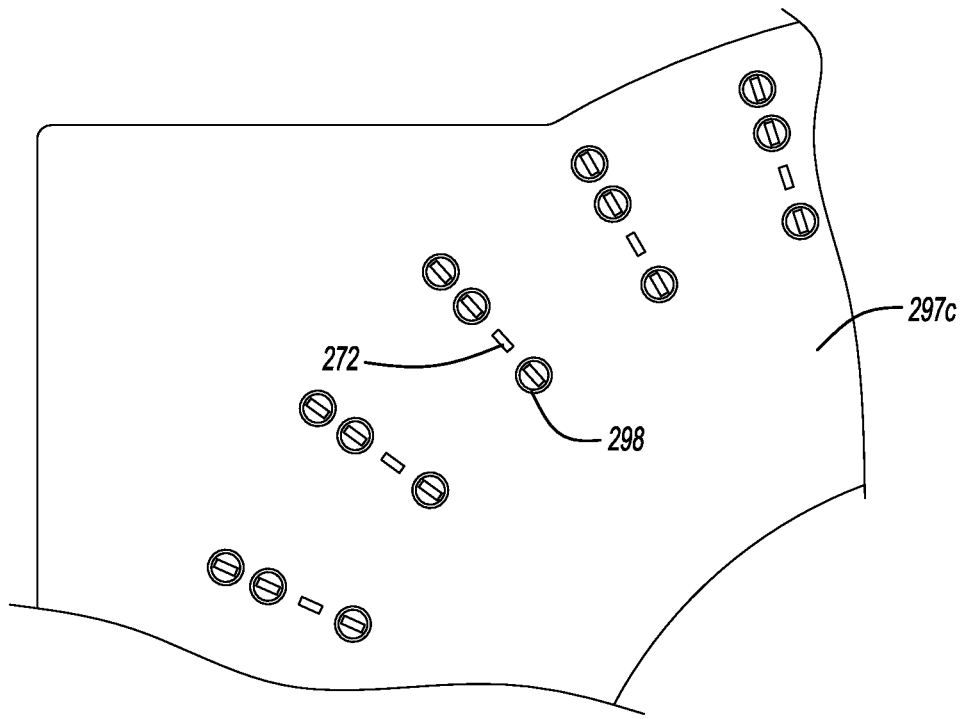
Figure 15:
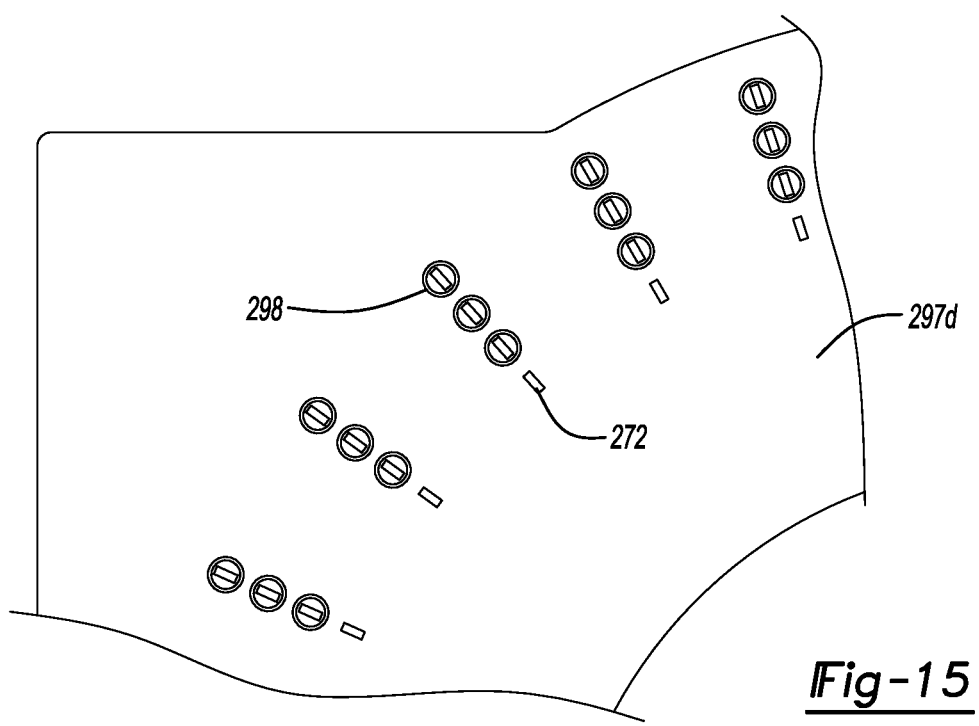
Figure 16:
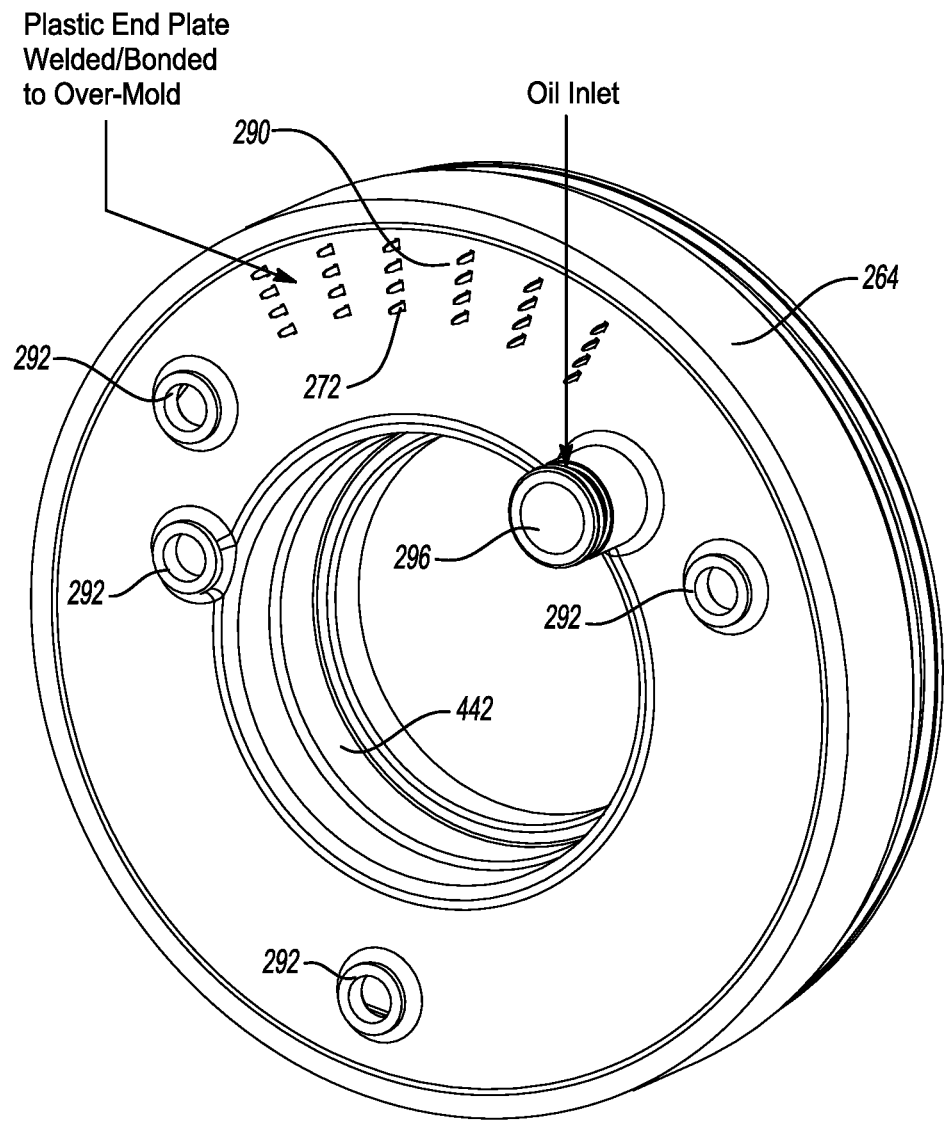
FIG. 16 is a perspective view of the inverter shown with an end plate.

The power semiconductor package 262 has phase lead bosses 288, which can accept phase leads 294 (FIG. 3) of the field windings 36 (FIG. 3) therethrough. The power semiconductor package 262 can also have an oil inlet port 296 (FIG. 11).

A method for fabricating the power semiconductor package 262 includes providing the heat sink 274 and attaching the semiconductor die 266 including the power semiconductor device 268 to the mount 278 of the heat sink 274. The method includes coupling each of the leads that is not unitarily and integrally formed with the mount 278 (e.g., electrically conductive leads 272b, 272c, 272d) to an associated terminal 270 via the bond wires 284 and encapsulating the semiconductor die 266 and the mount 278 with the case 281 using an overmolding process.

With reference to FIGS. 3, 4, 7, and 11 through 15, the inverter mount 264 can be formed of a second electrically insulating material that is different than the first insulating material of the case 281, such as a plastic material. The inverter mount 264 can define a mounting flange 295 disposed circumferentially about the power semiconductor assembly 250. At least a portion of the electrically conductive leads 272 can be received through the mounting flange 295 and can be electrically and mechanically coupled to the circuit board assembly 252 via one or more bus bars 297a, 297b, 297c, 297d (collectively referred to hereinafter as "bus bars 297"), such as a printed circuit board. The bus bars 297 can be stacked against stacked against one another and electrically coupled to the electrically conductive leads 272 as well as to the phase leads 294 of the field windings 36 of the stator 32. The quantity of printed circuit boards is dependent upon the thickness of the electrical traces or conductors on each of the printed circuit boards and the amount of current that is to pass through between each power semiconductor package 262 and an associated one of the field windings 36. The bus bars 297 may be electrically insulated from each other via insulating spacers 298 such that each of the electrically conductive leads 272 is electrically and mechanically coupled to one of the bus bars 297.

Figure 3:
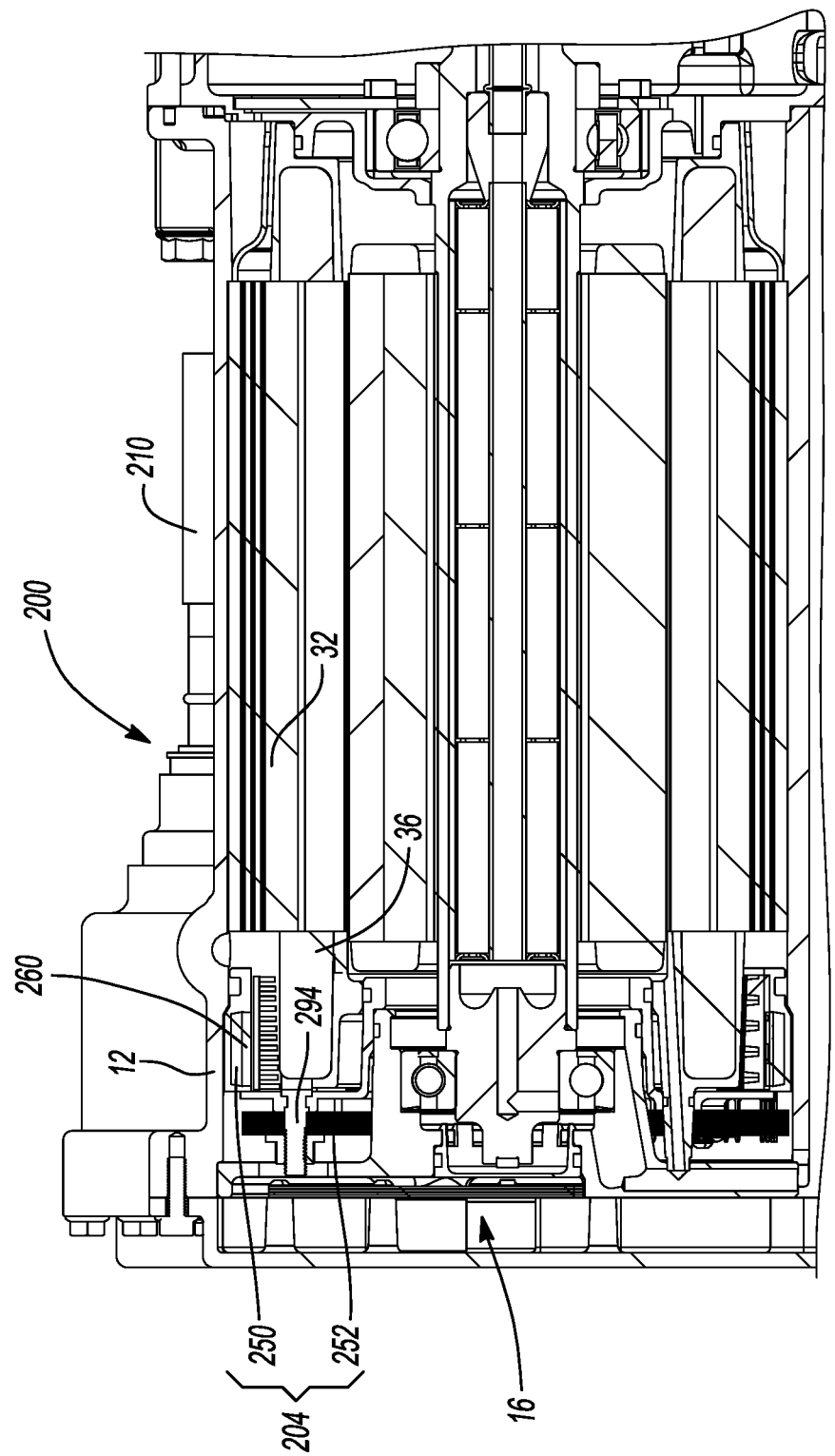
FIGS. 3 and 4 are sections view of a portion of the electric drive unit of FIG. 1, illustrating the construction of a motor assembly in more detail.
Figure 4:
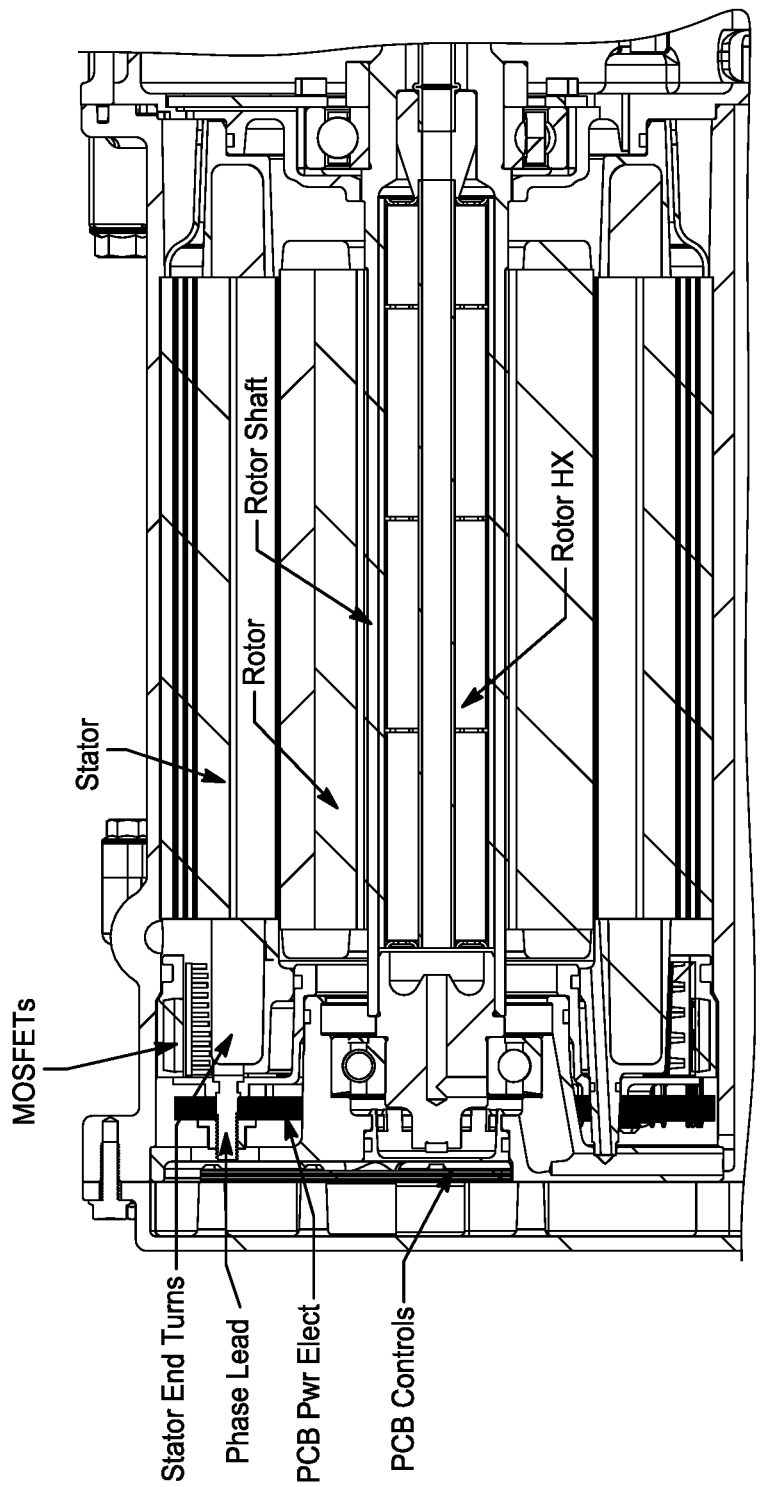
Figure 17:
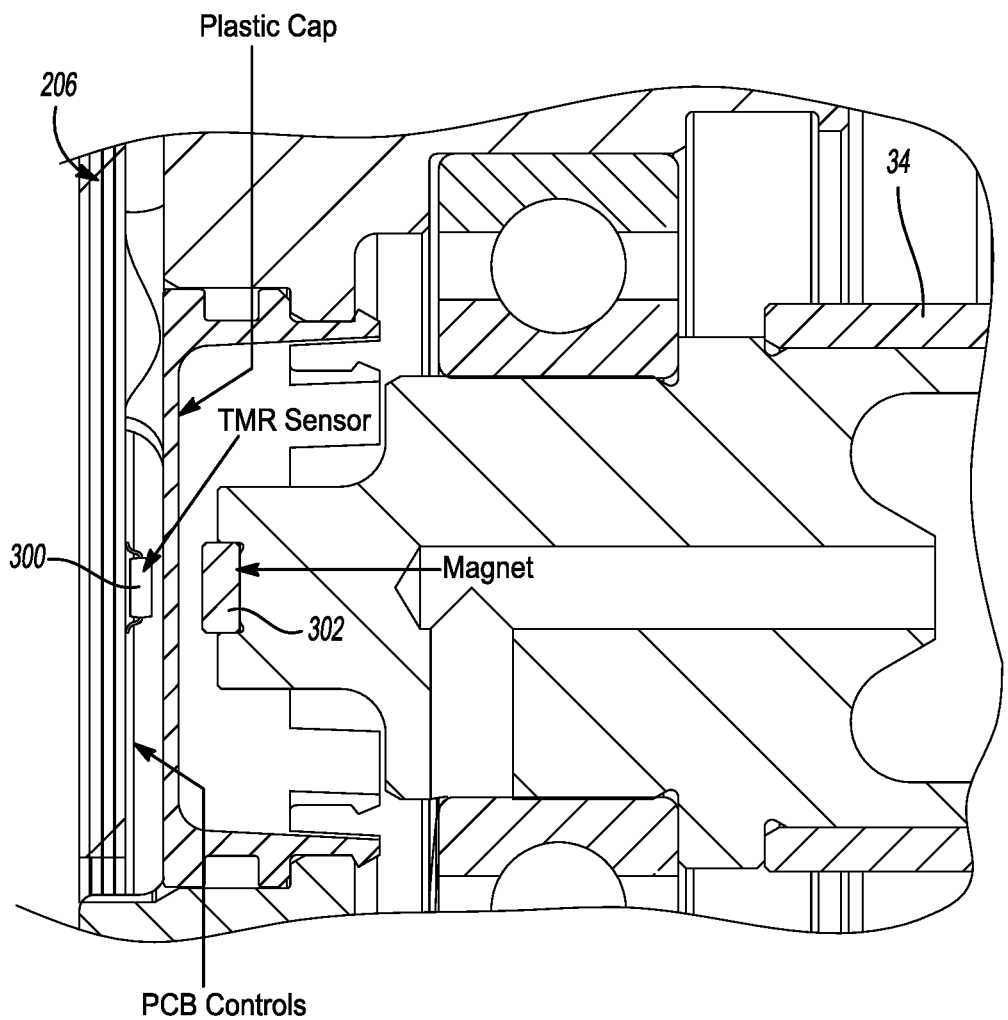
FIG. 17 is a sectional view of a portion of the electric drive unit of FIG. 1, illustrating a sensor assembly having a TMR sensor that is mounted to a control board and a magnet that is coupled for rotation with a rotor of the motor assembly.

With reference to FIG. 17, the controller 206 is configured to sense a rotational position of the rotor 34 relative to the stator 32 (FIG. 1) and responsively control the flow of electric power from the inverter 204 (FIG. 3) to the field windings 36 (FIG. 3) to rotate the magnetic field that is produced by the field windings 36 (FIG. 3). The controller 206 can include a second circuit board assembly that can comprise a plurality of stacked printed circuit boards. The second circuit board assembly can have conventional hardware and control programming for operating the electric motor 14 (FIG. 1) and a TMR sensor 300 that is configured to sense a rotational position of a magnetic field of a magnet 302 that is fixedly coupled to the rotor 34. The TMR sensor 300 and the magnet 302 can optionally be used in place of a conventional encoder or resolver. Significantly, the controller 206 uses direct voltage traces on the various printed circuit boards and/or the electrically conductive leads 272 instead of resistors to determine current flow.

Figure 18:
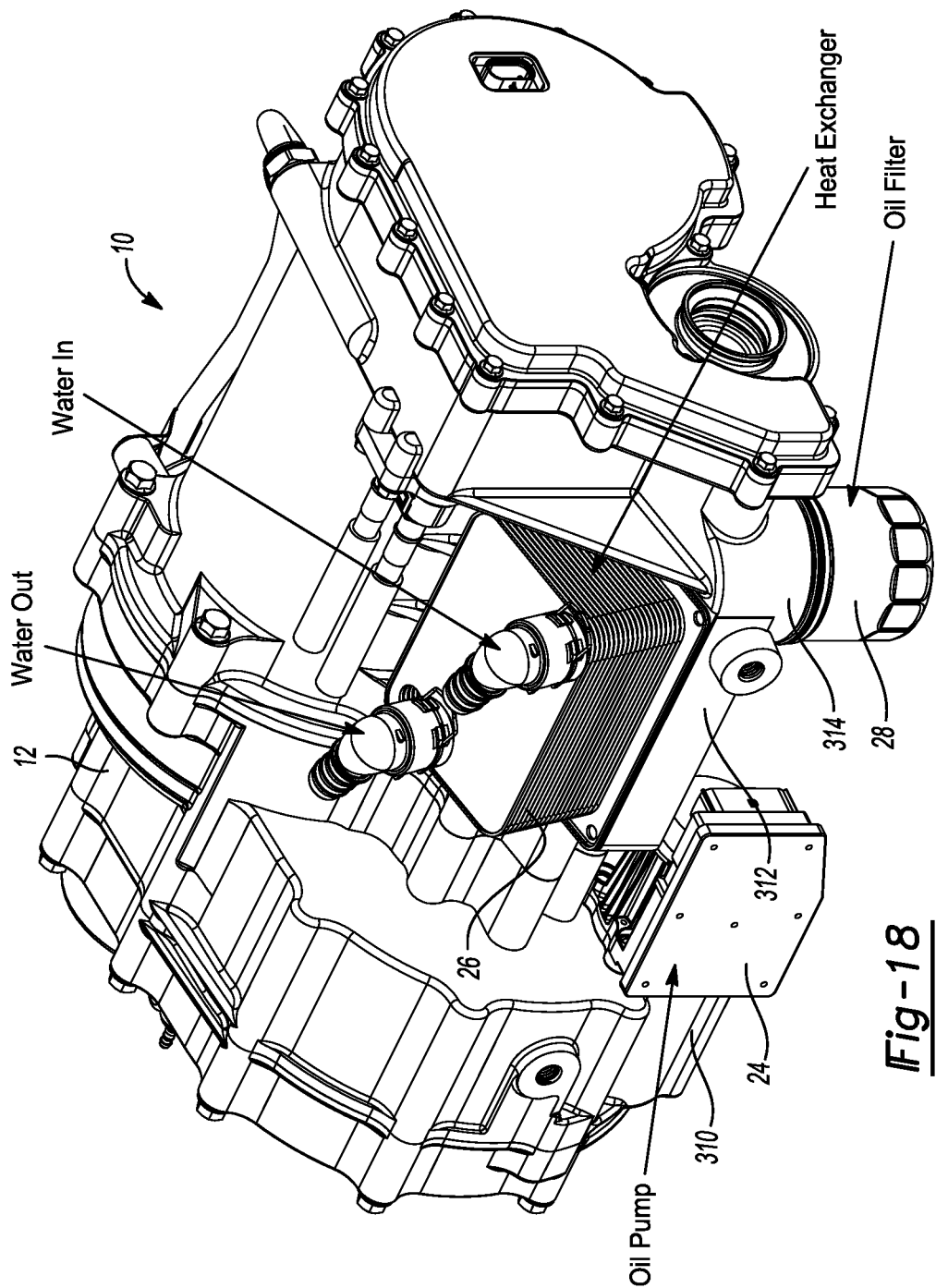
FIG. 18 is a perspective view of the electric drive unit of FIG. 1.

In FIG. 18, the housing assembly 12 is shown to have a pump mount 310, a heat exchanger base 312 and a filter mount 314. The pump 24 can be mounted to the pump mount 310 and can circulate an appropriate fluid about the electric drive module 10 to both lubricate and/or cool various components. In the example provided the fluid is a suitable dielectric fluid, such as automatic transmission fluid. The heat exchanger 26 can be mounted to the heat exchanger base 312 and can be configured to receive a pressurized cooling fluid, such as a water-glycol mixture, from an external source and to facilitate the transfer of heat from the dielectric fluid circulated in the electric drive module 10 to the pressurized cooling fluid. A suitable filer, such as a spin-on oil filter 28, can be mounted to the filter base 314 and can filter the dielectric fluid that is circulated within the electric drive module.

Figure 19:
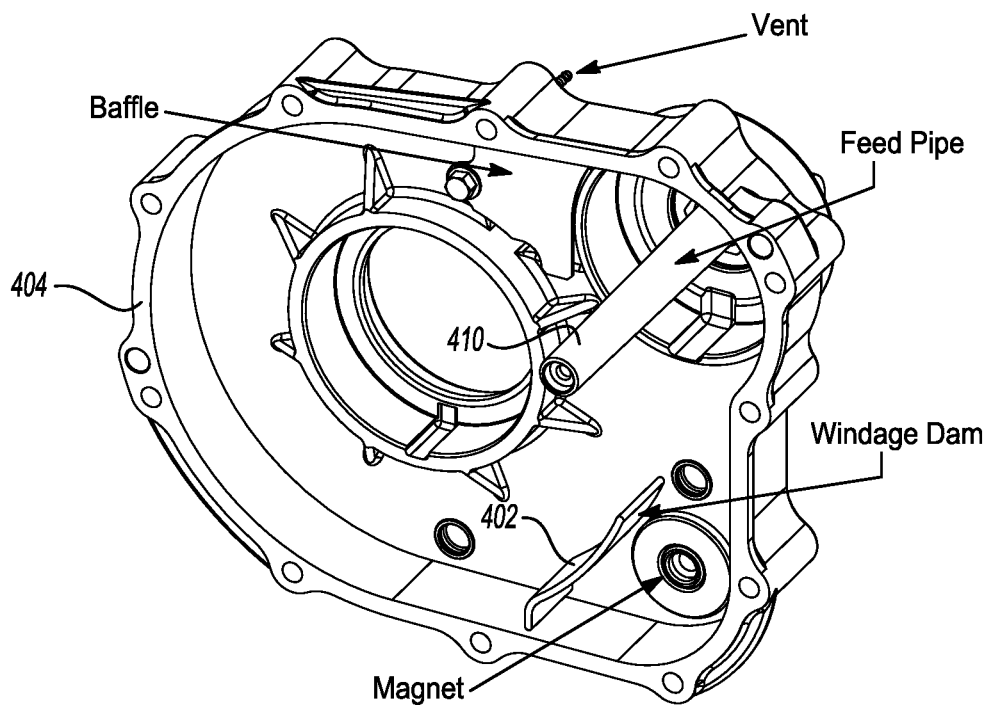
FIG. 19 is a rear perspective view of a portion of a housing of the electric drive unit of FIG. 1.
Figure 20:
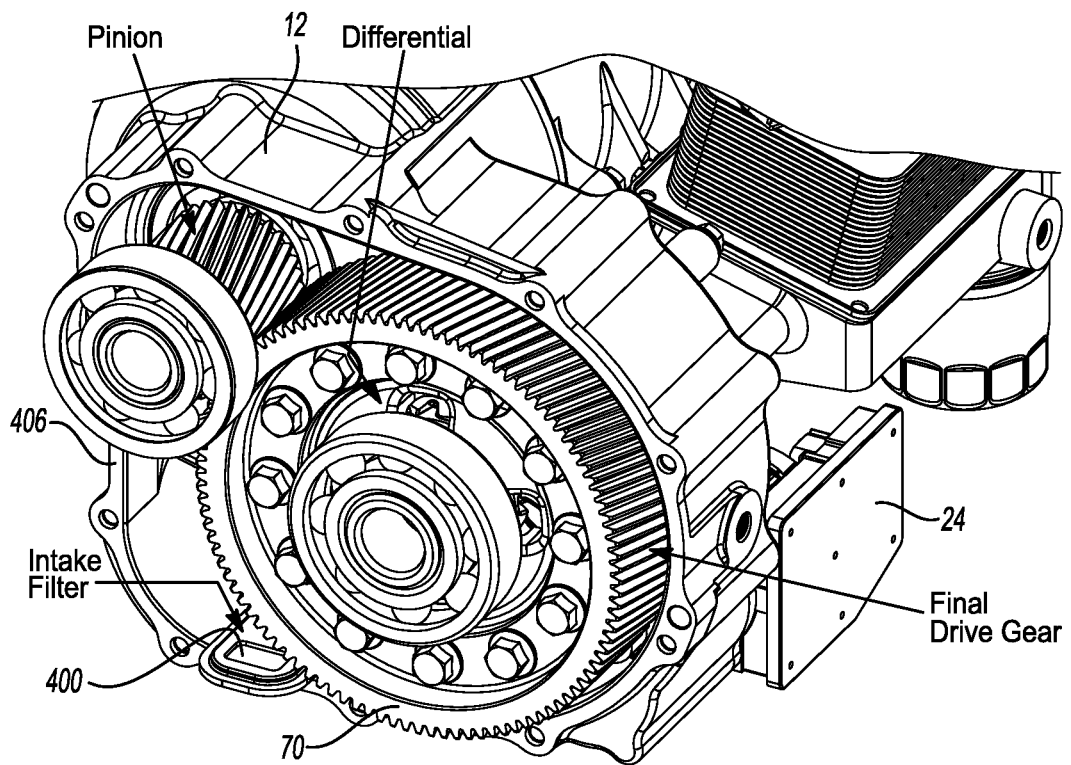
FIG. 20 is a perspective view of a portion of the electric drive unit of FIG. 1 with the portion of the housing shown in FIG. 18 removed.
Figure 21:
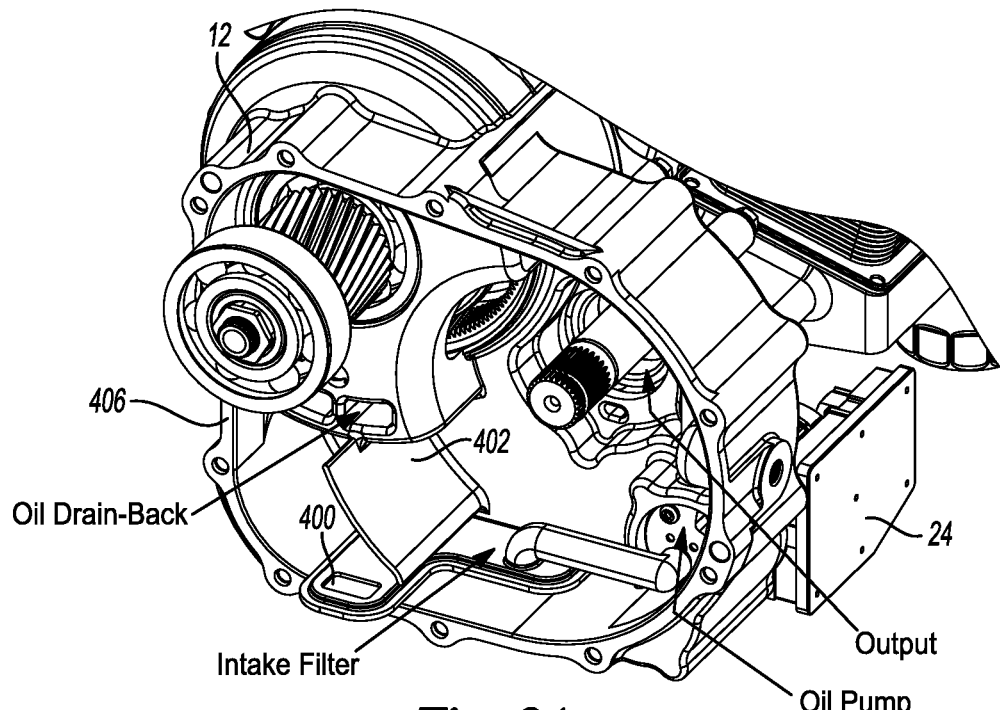
FIG. 21 is similar to that of FIG. 19, but depicting the electric drive unit with a portion of a transmission and a differential assembly removed.

With reference to FIGS. 19 through 21, an intake filter or screen 400 can be disposed in a portion of the housing assembly 12 that houses the differential input gear 70. The intake filter 400 can receive dielectric fluid that can be returned to the low-pressure side of the pump 24. A windage dam 402 can be integrated into a cover 404 and a main housing portion 406 of the housing assembly 12 to shield the dielectric fluid that is being returned to the intake filter 400 from the differential input gear 70. More specifically, the windage dam 402 can cause dielectric fluid to accumulate in the vicinity of the intake filter 400 and segregate the accumulated fluid from the (rotating) differential input gear 70. It will be appreciated that without the windage dam 402, the rotating differential input gear 70 would tend to pull dielectric fluid away from the intake filter 2400, which could prevent sufficient dielectric fluid from being returned to the low pressure (intake) side of the pump 24. It will also be appreciated that segregating the dielectric fluid from the rotating differential input gear 70 can reduce drag losses that would otherwise be incurred from the rotation of the differential input gear through the dielectric fluid. The cover 404 can also include a tubular feed pipe 410.

Figure 22:
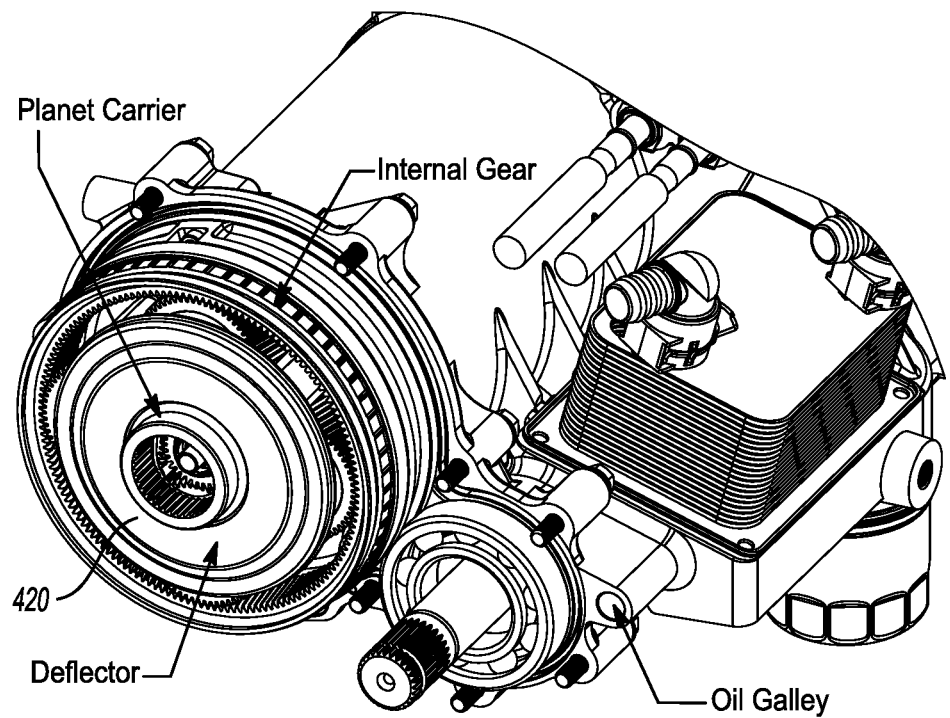
FIG. 22 is similar to that of FIG. 20, but depicting a further portion of the housing removed to better show a portion of the transmission.
Figure 23:
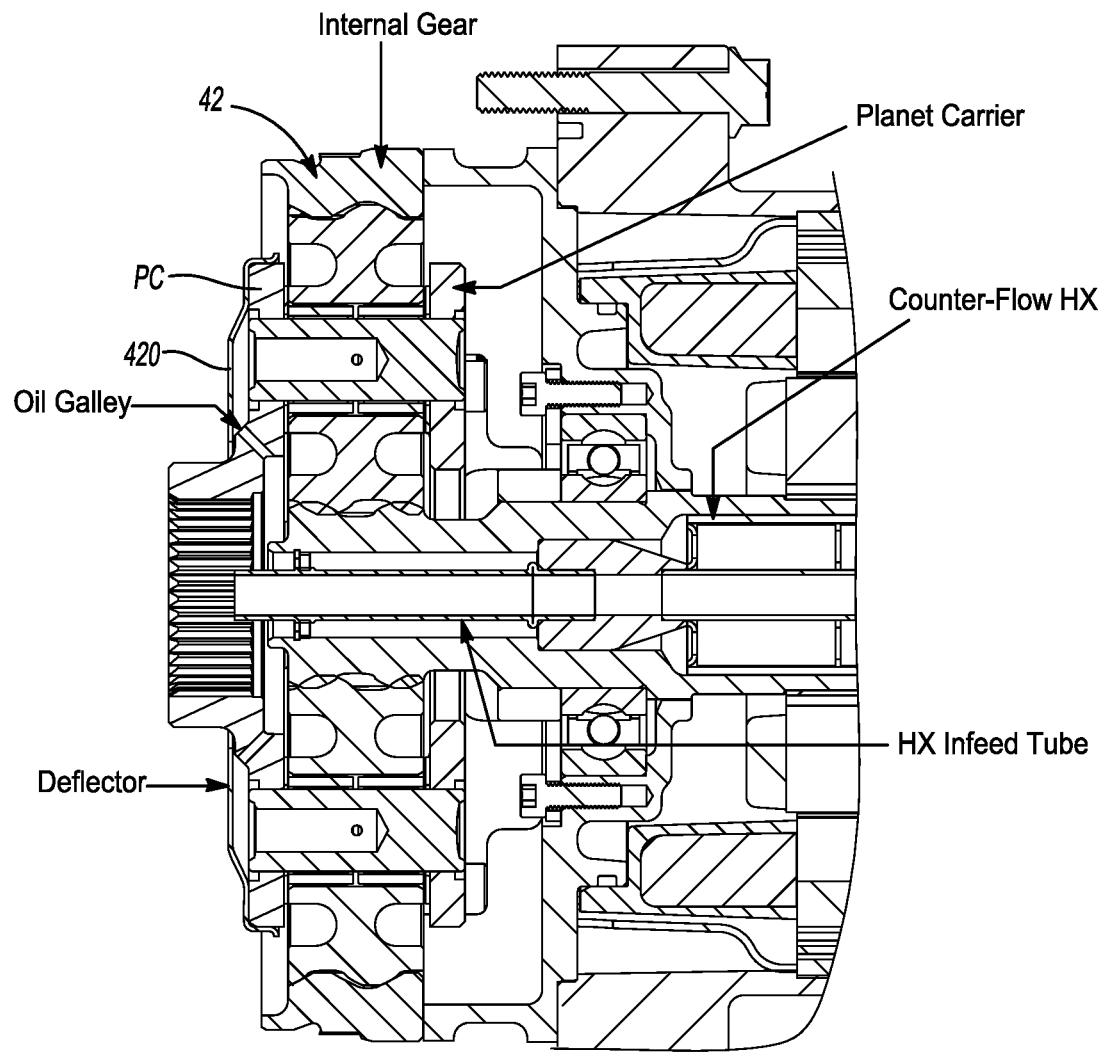
FIG. 23 is a sectional view of a portion of the electric drive unit that is shown in FIG. 21.

With reference to FIGS. 22 and 23, a deflector 420 can be mounted to the planet carrier PC and can shield the planetary reduction 42 from dielectric fluid that is slung from other rotating components and/or cause dielectric fluid to drain from the planetary reduction 42 in a desired manner.

Figure 24:
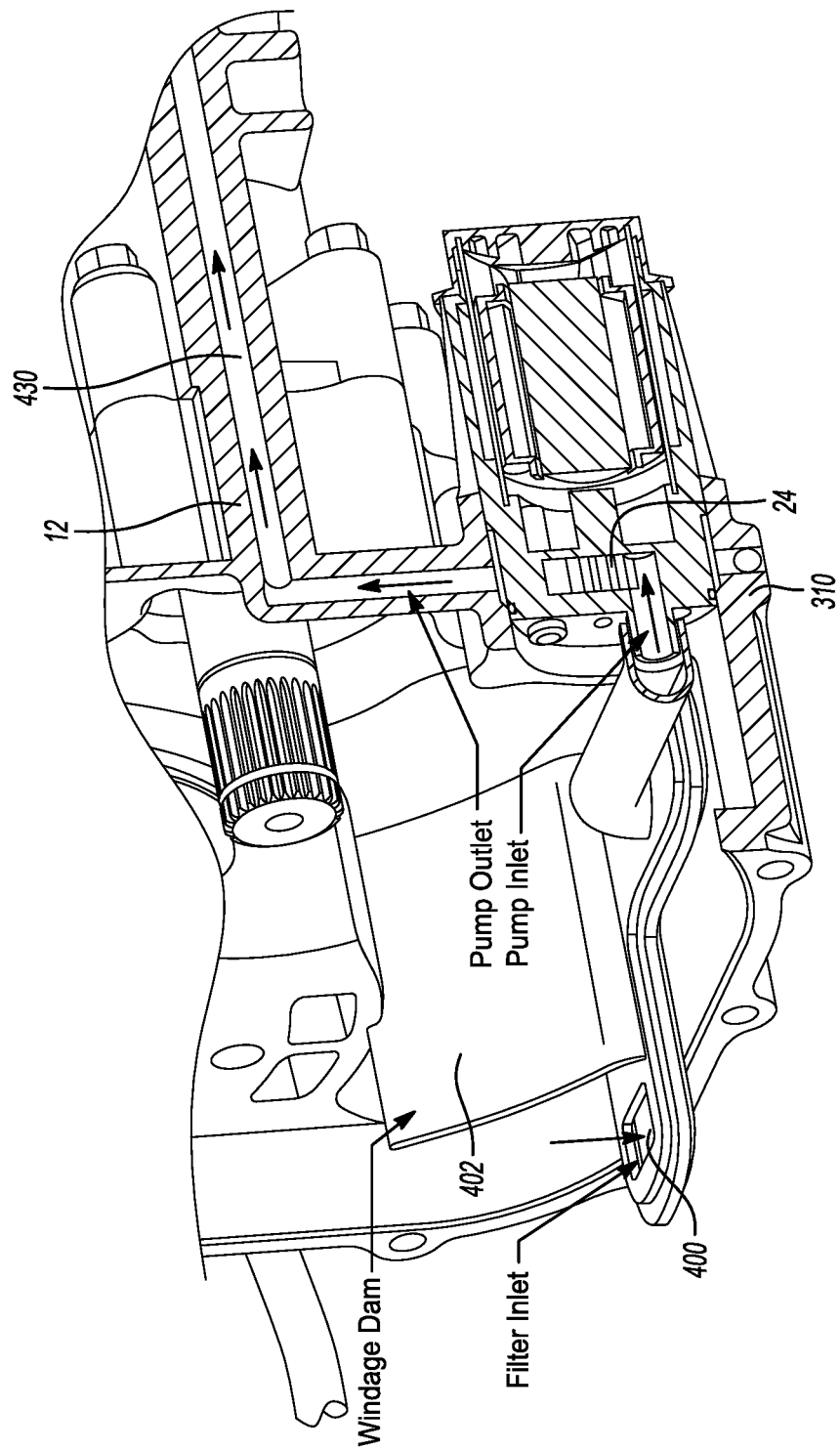
FIGS. 24 through 45 are section views of various portions of the electric drive unit of FIG. 1, depicting the flow of cooling and lubricating oil through various portions of the electric drive unit.
Figure 25:
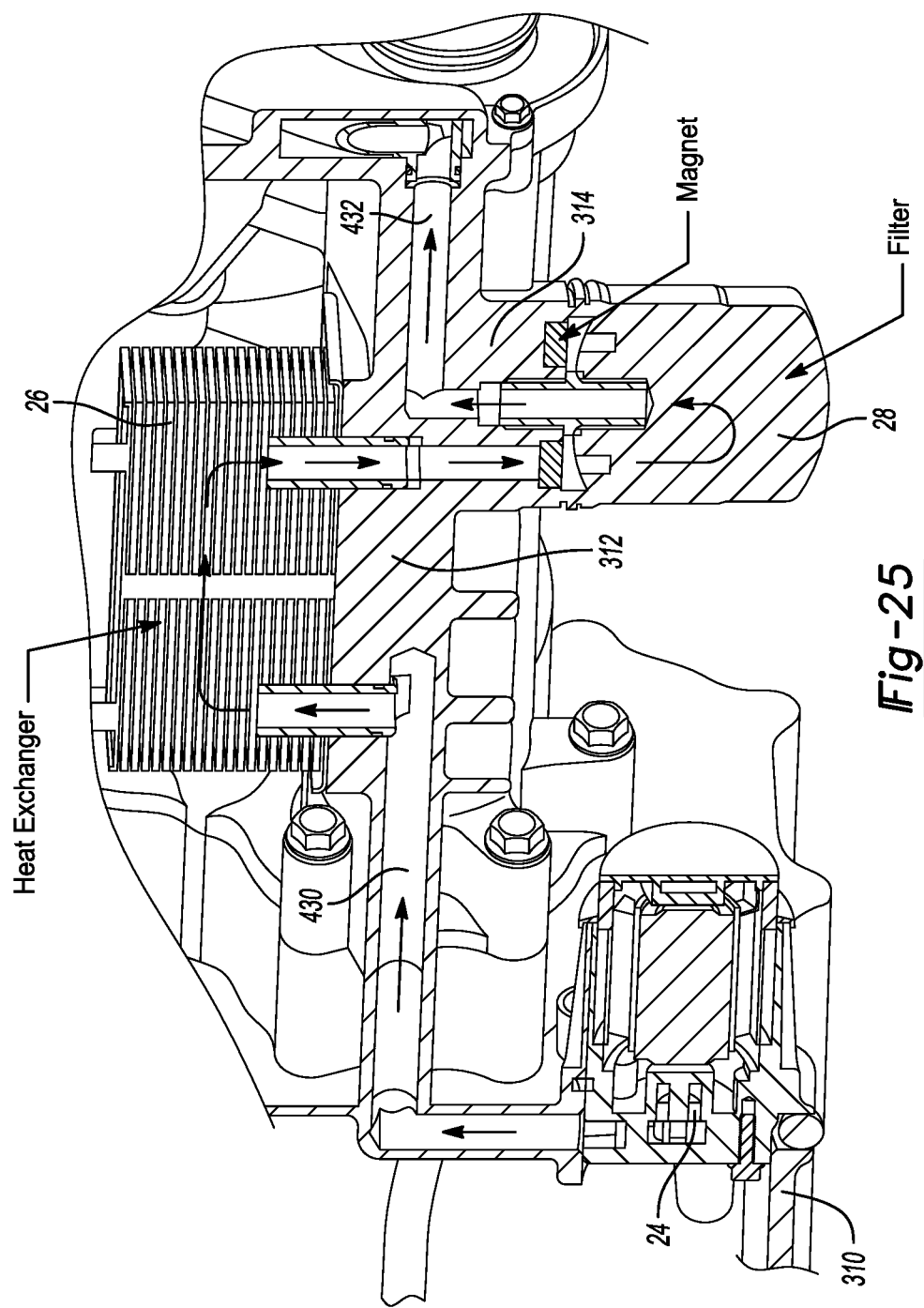

In FIGS. 24 and 25, dielectric fluid is received into the intake filter 400 and transmitting to the low pressure (inlet) side of the pump 24. High pressure dielectric fluid exits the pump 24 and travels through an internal gallery 430 in the housing 12 to an inlet passage of the heat exchanger base 312, through the heat exchanger 26, into an outlet passage of the heat exchanger base 312, into an inlet passage of the filter base 314, through the filter 28, into an outlet passage in the filter base 314 and to another internal gallery 432 in the housing 12.

Figure 26:
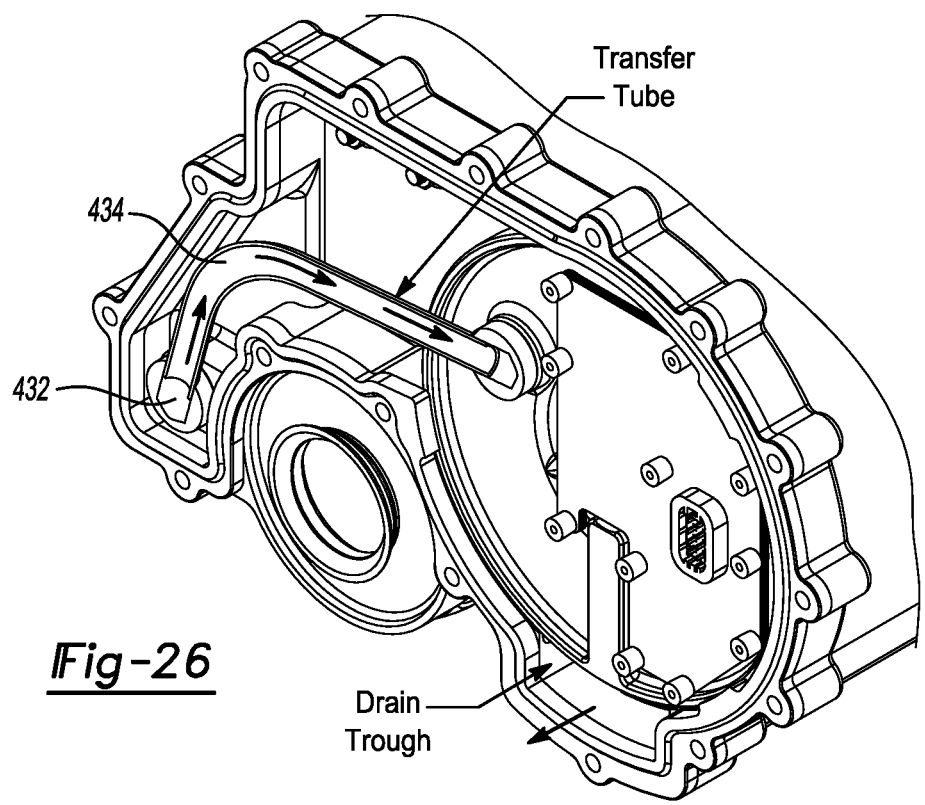
Figure 27:
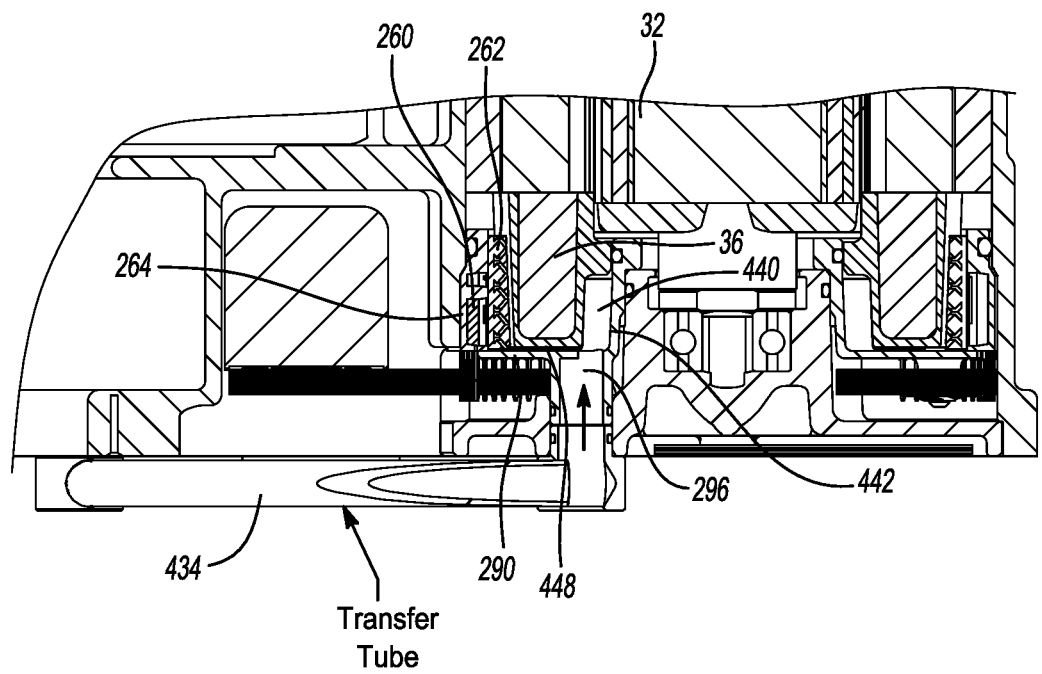

In FIGS. 26 and 27, dielectric fluid exiting the internal gallery 432 can travel through a transfer tube 434 through the oil inlet port 296 in the end plate 290 and can enter an annular cavity 440 that is located radially between a tubular central projection 442 on the end plate 290 and the field windings 36. The central projection 442 can carry a seal that can be sealingly engaged to the central projection 442 and to the field windings 36. An annular gap 448 is formed between an axial end of the field windings 36 and an annular portion of the end plate 290. As noted previously, the end plate 290 is fixedly and sealingly coupled to the inverter mount 264.

Figure 28:
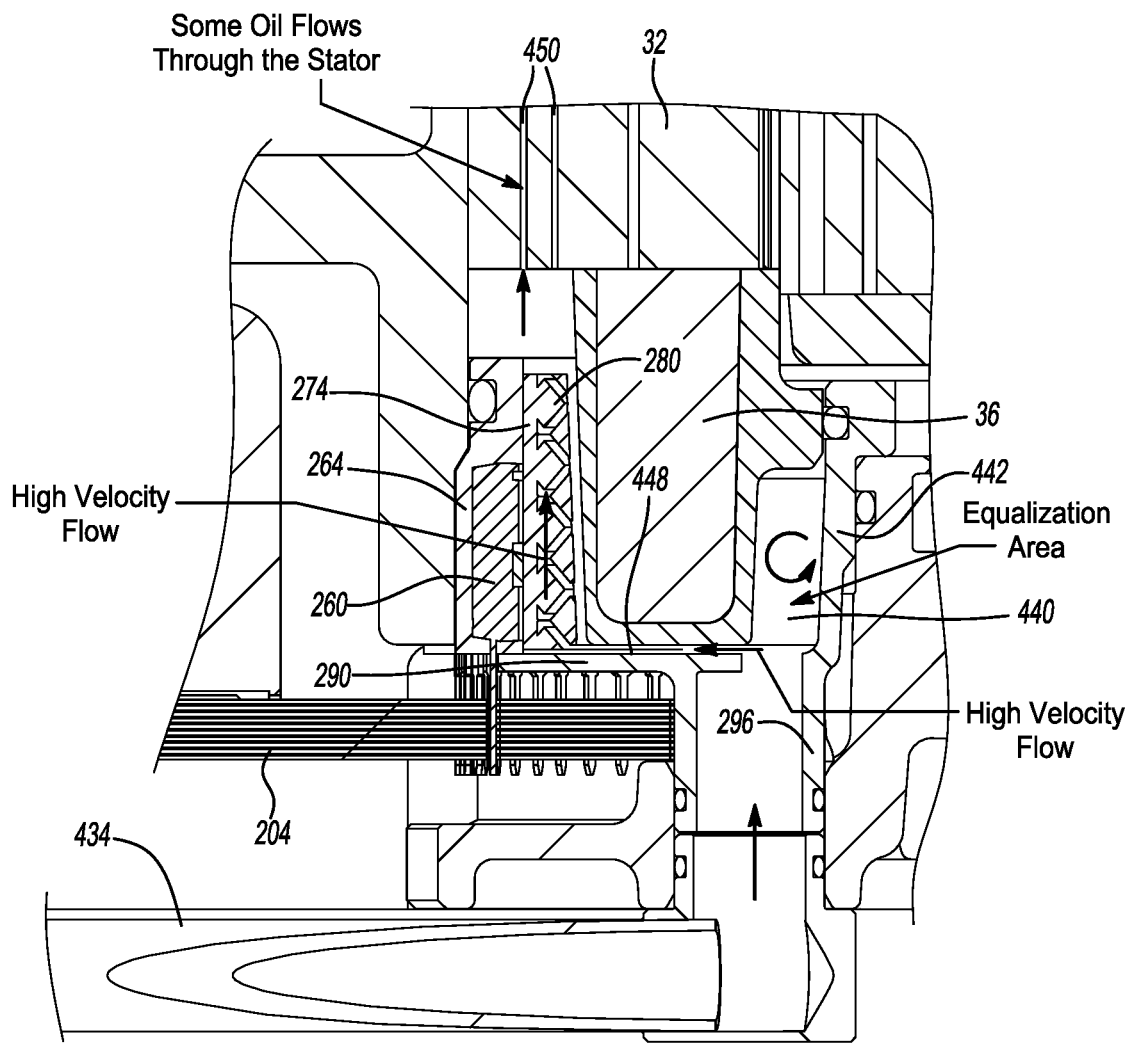
Figure 29:
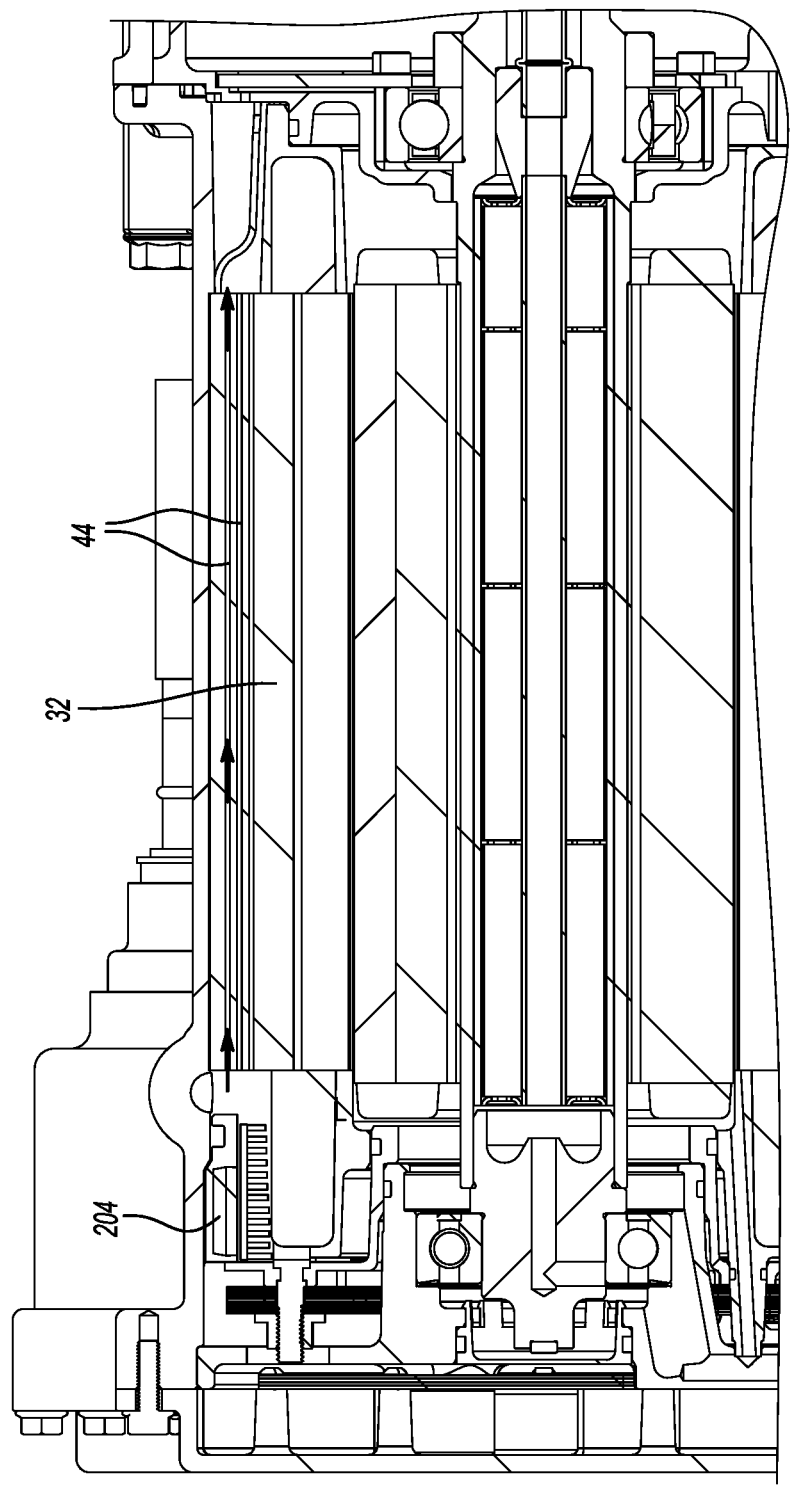

In FIG. 28, the dielectric fluid is shown to flow through the annular gap 448, through the fins 280 in the heat sinks 274 and into passages 450 formed axially through the stator 32. While the fins 280 have been depicted herein as perpendicular projections, it will be appreciated that the fins 280 could be shaped differently (for example, as diamond shaped projections) to cause the flow of dielectric fluid passing through the fins 280 to move in both tangential and axial directions. Flow in this manner may be beneficial for rejecting more heat from the heat sinks 274 into the dielectric fluid and/or to produce a desired flow restriction that can aid in the pressure balancing of the cooling flow to the rotor. Accordingly, it will be appreciated that dielectric fluid is introduced to the inverter 204, passes through fins 280 on heat sinks 274 that are electrically conductively coupled to the electrically conductive leads 272 to thereby cool the inverter 204, and thereafter enters the passages 450 in the stator 32 to cool the stator 32 as is shown in FIG. 29.

Figure 30:
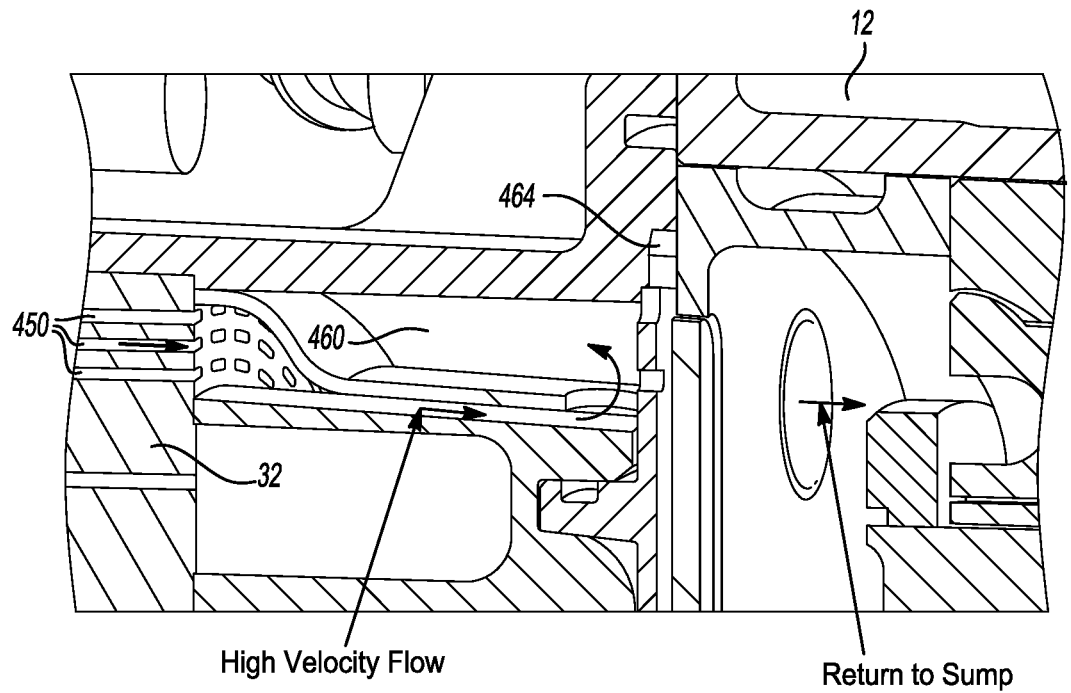
Figure 31:
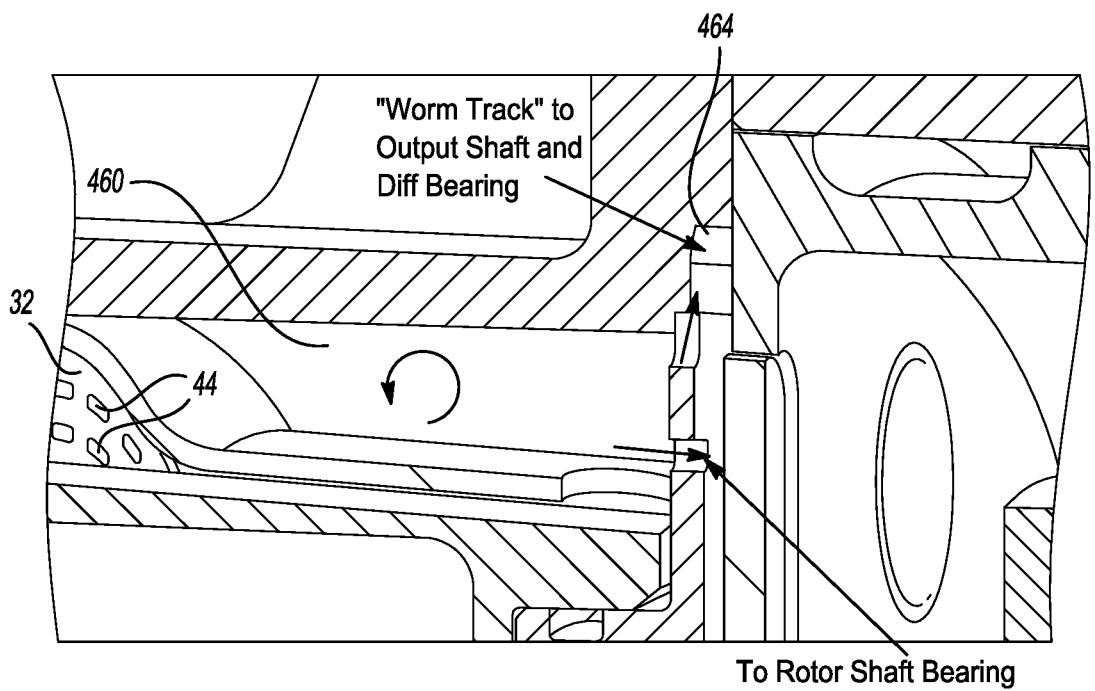

In FIGS. 30 and 31, dielectric fluid exiting the stator 32 is collected in an annular cavity 460 on an opposite end of the stator 32 that permits the velocity of the dielectric fluid to slow. A portion of the dielectric fluid is returned to a sump (not shown) in the housing assembly 12, while other portions of the flow are directed to lubricate various other components. For example, the annular cavity 460 can be in fluid communication with a worm track 464.

Figure 32:
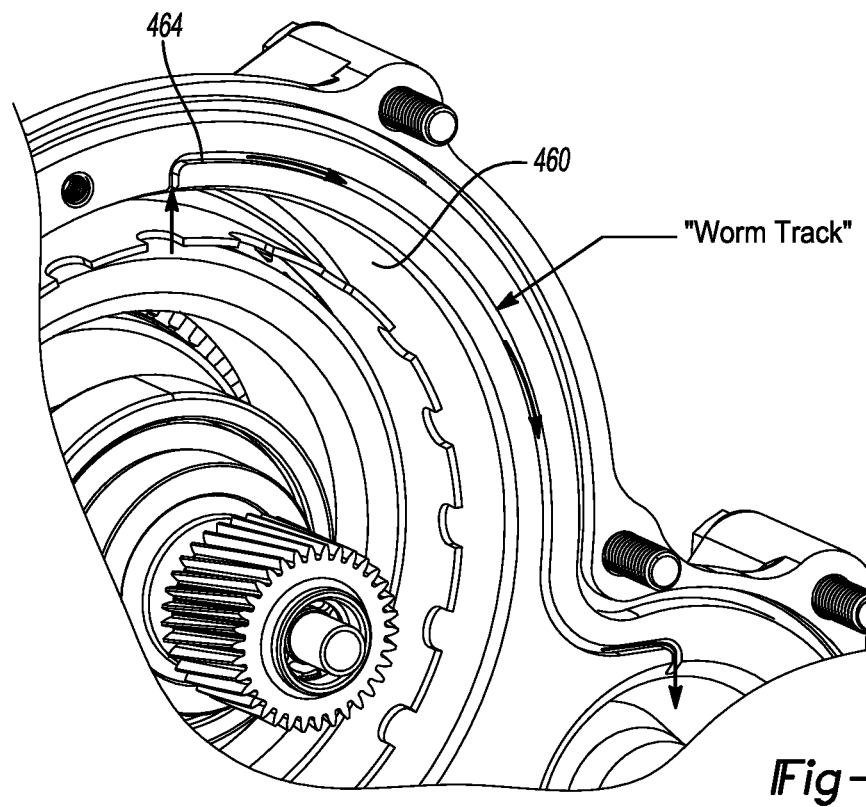
Figure 33:
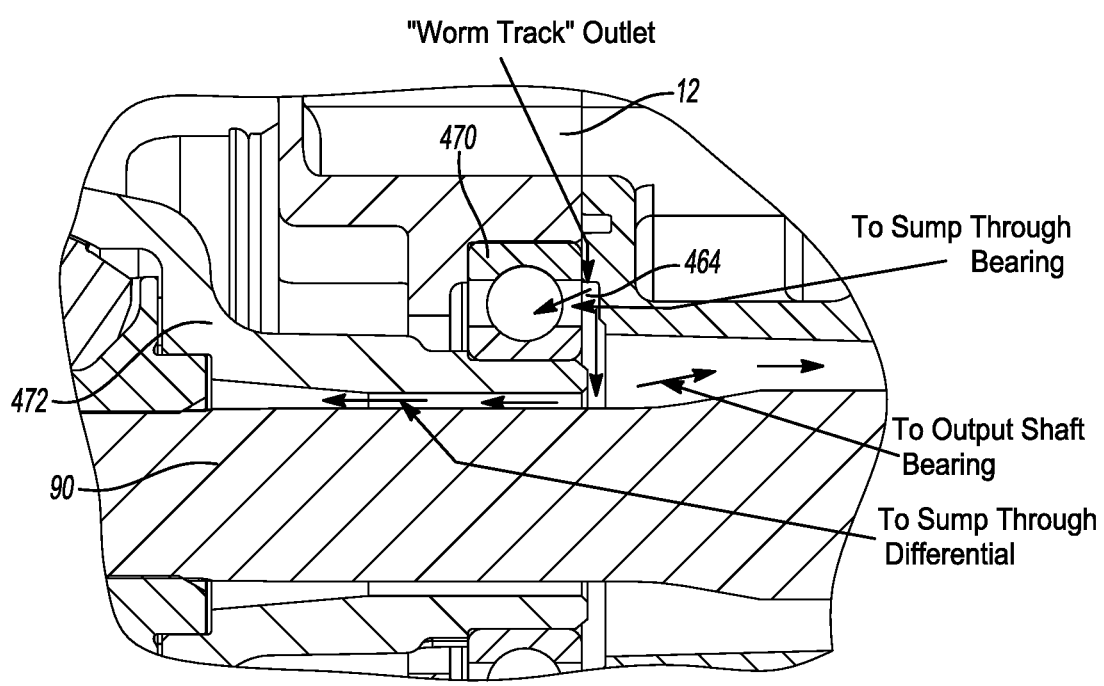
Figure 34:
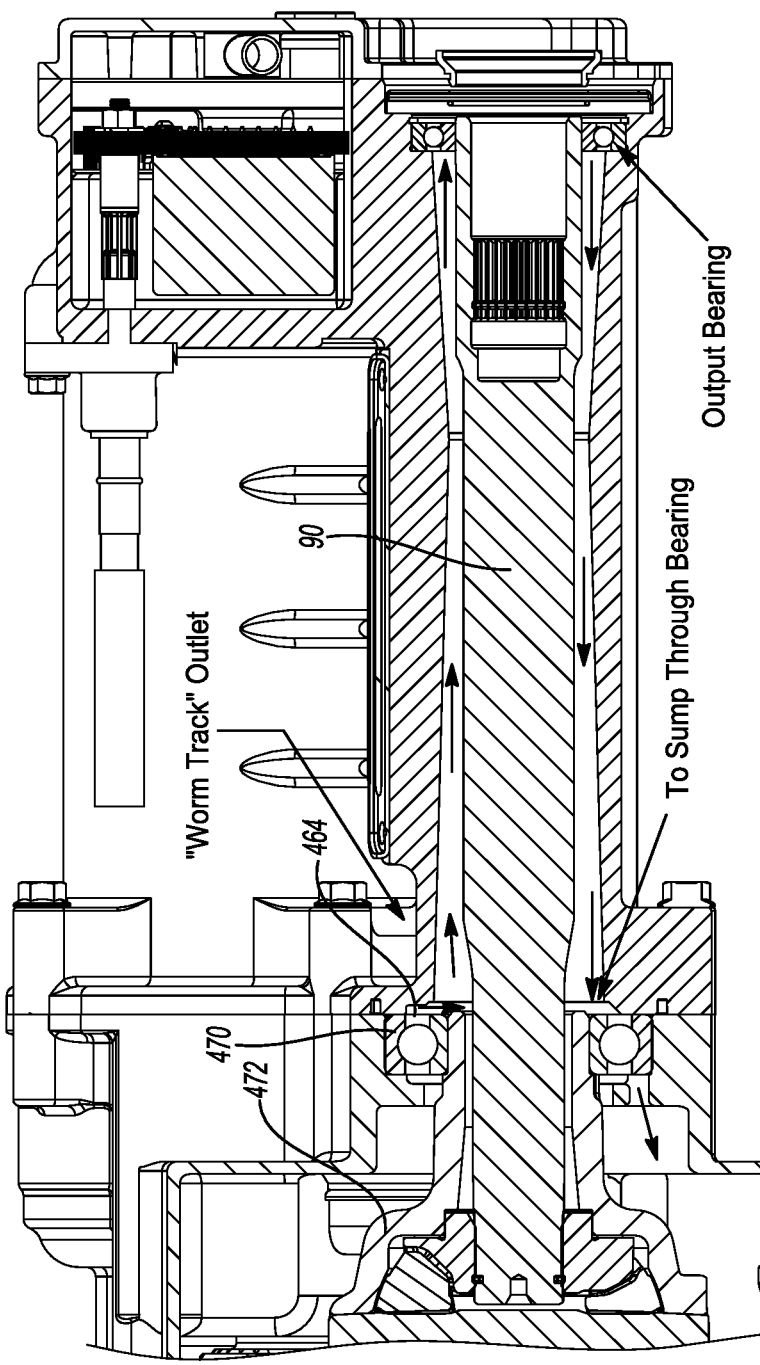

With reference to FIGS. 32 through 34, the worm track 464 can have an outlet that can discharge the dielectric fluid into a bearing 470, which can support the differential case 472 for rotation relative to the housing assembly 12, and/or onto the stub shaft 92, where the dielectric fluid can migrate to the opposite axial ends of the stub shaft 92 to lubricate the differential gearing and the bearing 94. Thereafter, the dielectric fluid can drain to the sump where it can flow into the intake filter 400 (FIG. 23).

Figure 35:
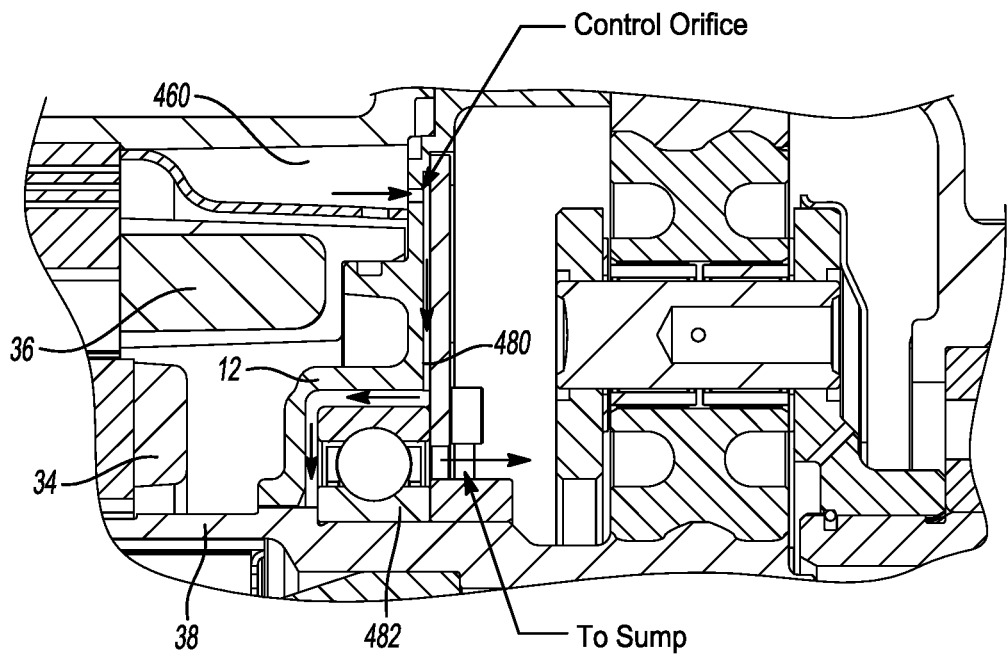
Figure 36:
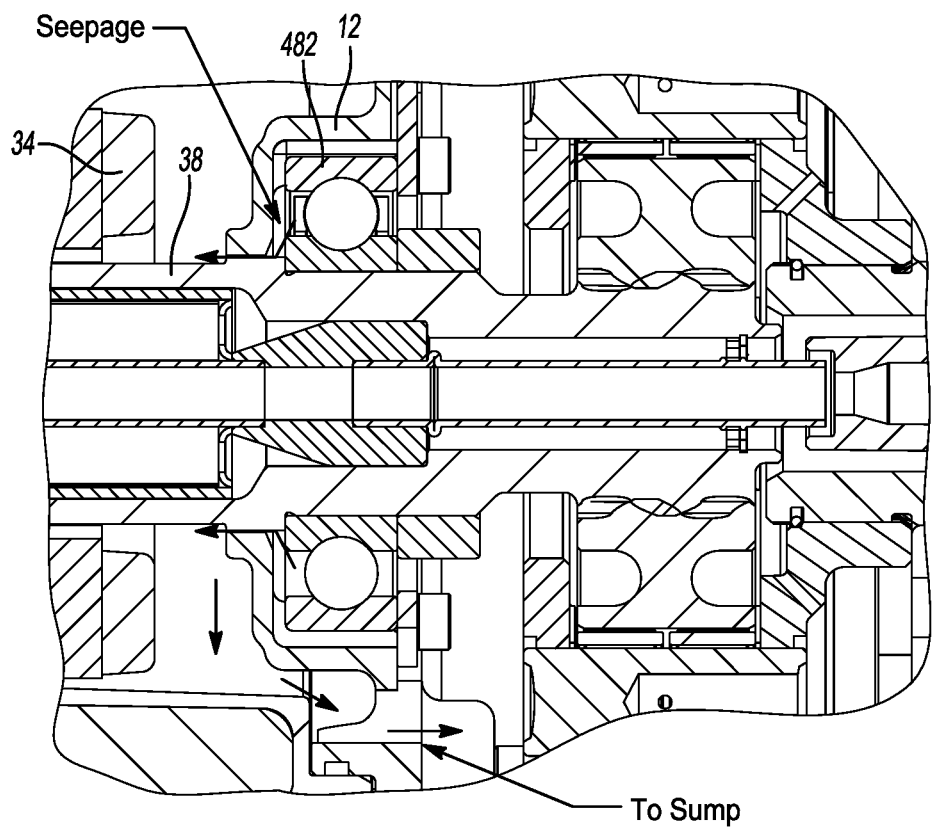

In FIGS. 35 and 36, the annular cavity 460 can be in fluid communication with a passage 480 that provides a flow of the dielectric fluid to a bearing 482 that supports the rotor shaft 38 relative to the housing assembly 12. Dielectric fluid that is discharged from the bearing 482 can seep between the housing assembly 12 and the rotor shaft 38 and can drain to the sump in the housing assembly 12.

Figure 37:
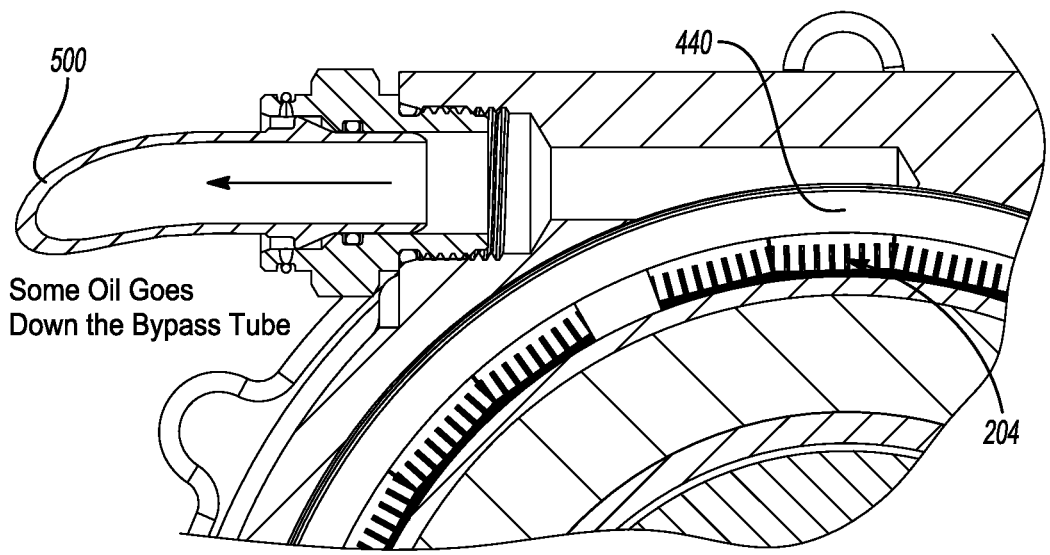

With reference to FIGS. 27, 28 and 37, a portion of the dielectric fluid in the annular cavity 440 can be discharged into a bypass tube 500. The amount of fluid that is discharged into the bypass tube 500 is based on pressure balancing between the flow that is directed through the bypass tube 500 and the portion of the flow that travels through the inverter 204 and the stator 32.

Figure 38:
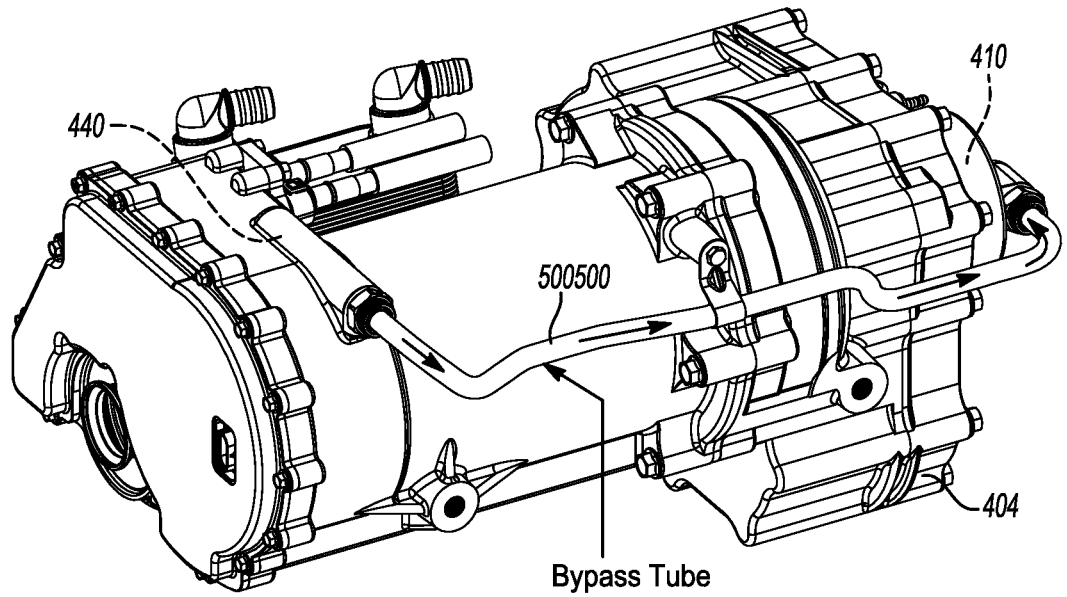

FIG. 38 depicts the dielectric fluid as it is discharged from the annular cavity 440 and transferred via the bypass tube 500 to the feed pipe 410 in the cover 404.

Figure 39:
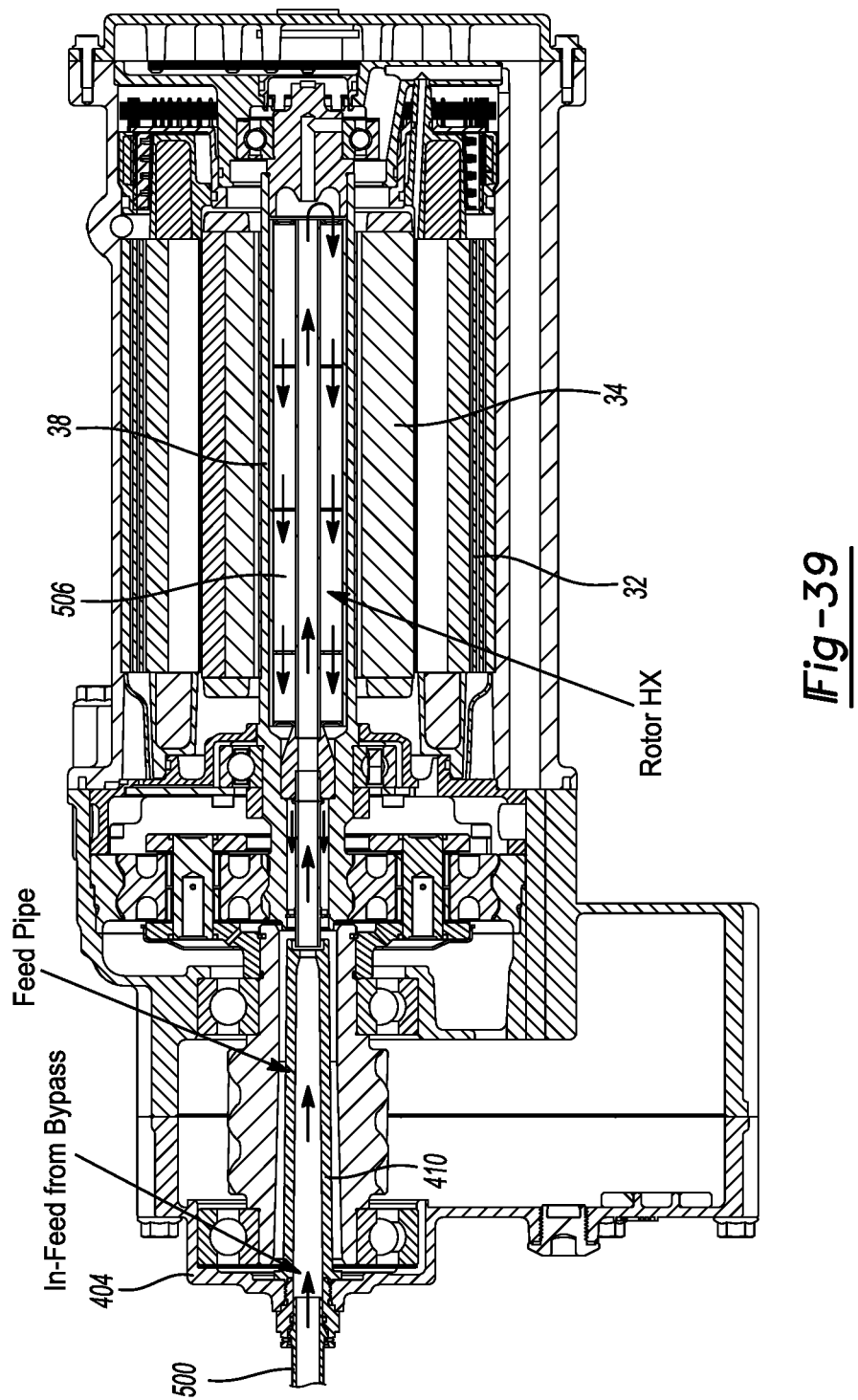

FIG. 39 depicts the bypass flow exiting the bypass tube 500, traveling through the feed pipe 410 in the cover 404 and being fed into a heat exchanger 506 that is mounted within the rotor shaft 38. The heat exchanger 506 receives the flow (inflow) of dielectric fluid along its rotational axis, and then turns the flow at the opposite end of the rotor 34 so that the flow of dielectric fluid flows concentrically about the inflow toward the end of the rotor 34 that received the inflow of the dielectric fluid.

Figure 40:
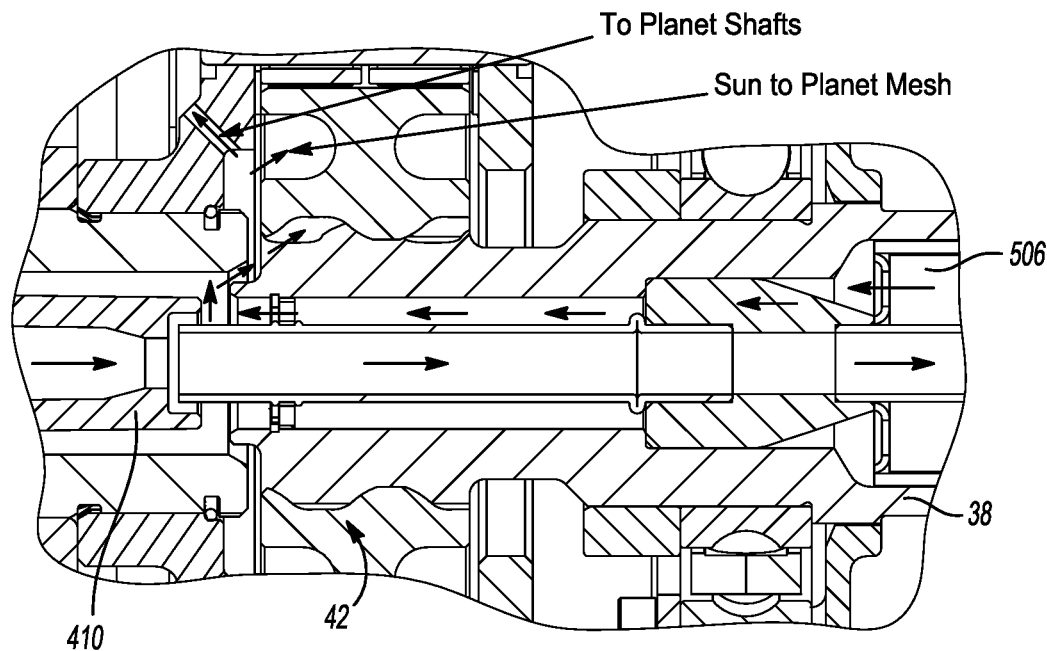
Figure 41:
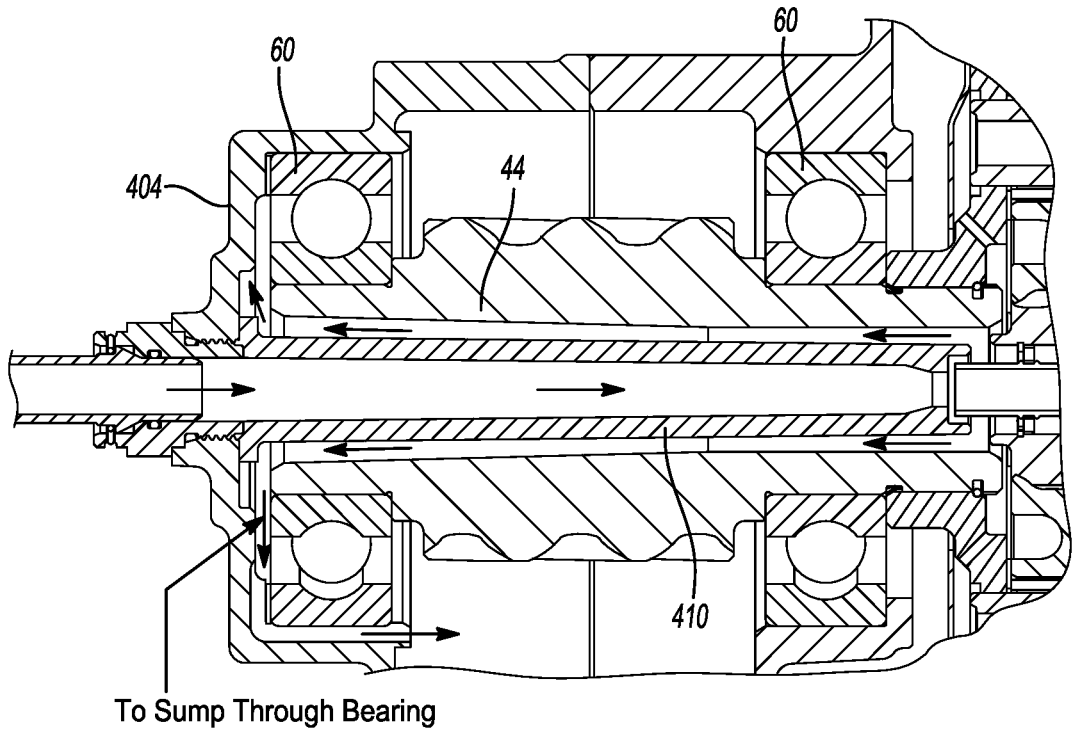
Figure 42:
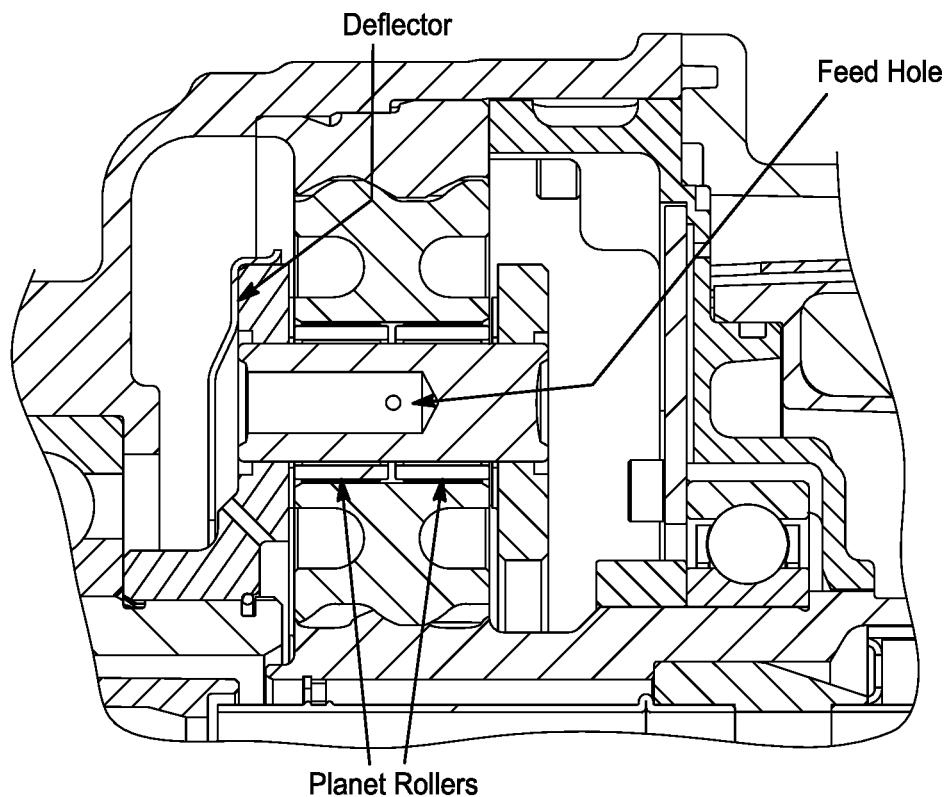
Figure 43:
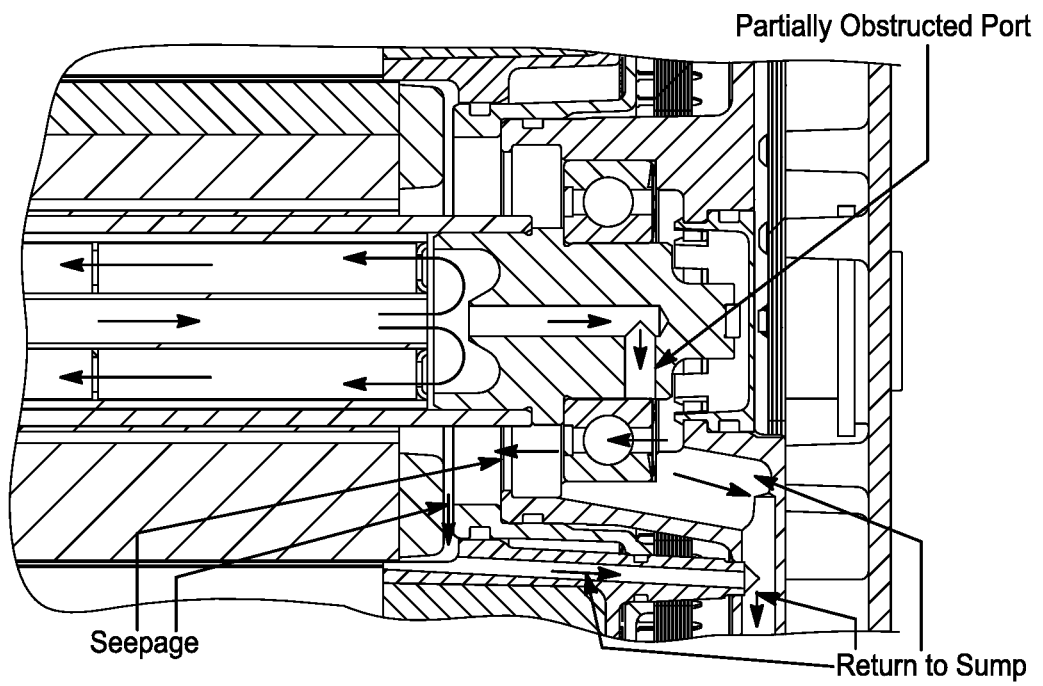
Figure 44:
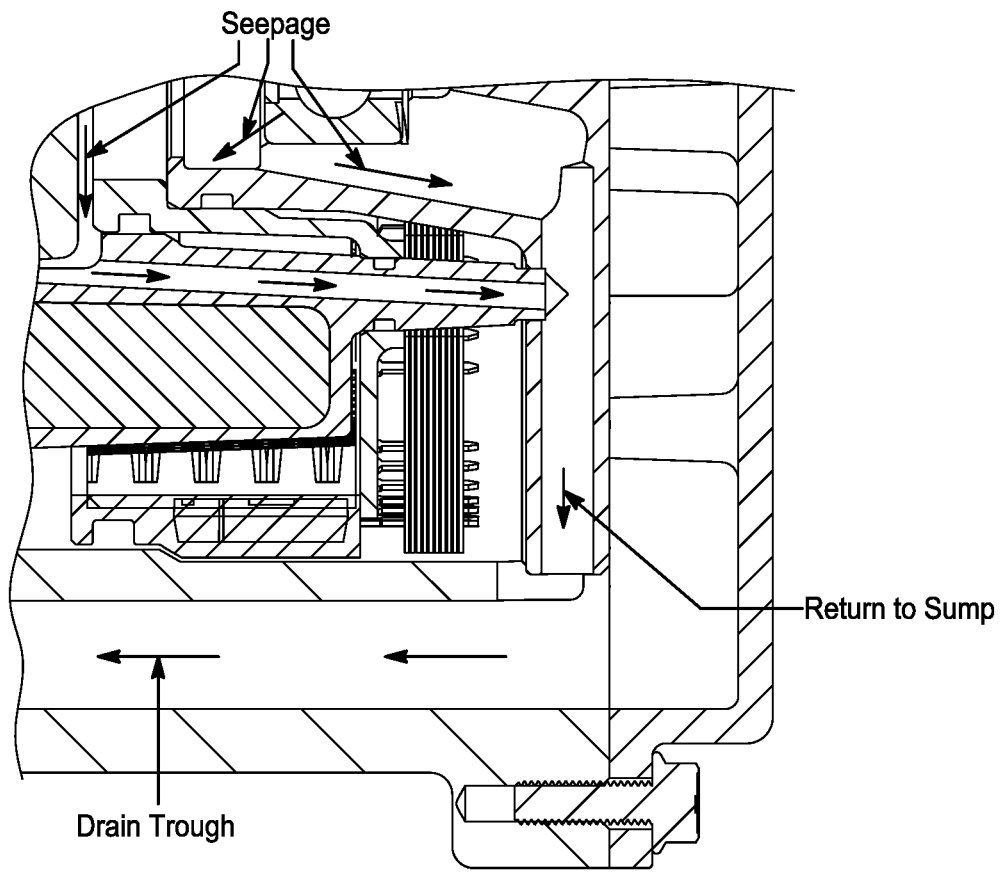
Figure 45:
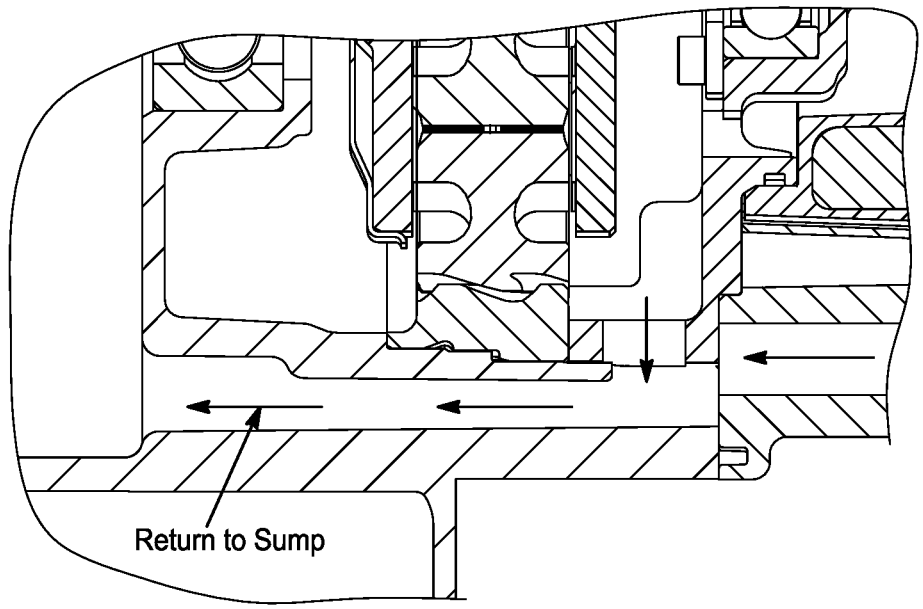

In FIGS. 40 and 41, the outflow of the dielectric fluid that exits the heat exchanger 506 in the rotor shaft 38 can be at least partly employed to lubricate the various components (i.e., bearings, shafts, gear teeth) of the planetary reduction 42, as well as the bearings 60 that support the shaft 44 of the transmission. Note that the feed pipe 410 in the cover 404 is received through a bore in the shaft 44. In the example provided, the feed pipe 410 is a discrete component that is assembled to the cover 404.

FIGS. 42 through 45 show various flows of dielectric fluid being used to lubricate various other components within the electric drive module.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electrical assembly comprising:
a stator having a plurality of field windings, each of the field windings having an associated phase leads; and
an inverter having an inverter mount and a plurality of power semiconductor packages, the inverter mount having an annular mounting flange and a plurality of phase lead bosses that are coupled to the annular mounting flange, each of the phase leads being received through a corresponding one of the phase lead bosses, each of the power semiconductor packages having a semiconductor die (266), a plurality of electric terminals, and a heat sink, each of the electric terminals being electrically coupled to the semiconductor die (266), the heat sink having a base and a plurality of fins, the base being fixedly and electrically coupled to one of the electric terminals, each of the fins extending axially from the base in a direction away from the semiconductor die (266), each of the power semiconductor packages being mounted to the inverter mount such that at least a portion of the electric terminals of each of the power semiconductor packages extends through the mounting flange, wherein the power semiconductor packages are arranged in a circumferential spaced apart manner, wherein the fins of each heat sink are arranged in rows, wherein the fins in each row taper such that a radially-inner most one of the fins in each of the rows is shorter than a radially-outer most one of the fins in each of the rows, and wherein a plurality of slots are formed in the base on a radially-inner side of the base, each of the slots extending toward a radially-outer side of the base and intersecting a corresponding one of the rows of fins.

2. The electrical assembly of claim 1, wherein each row that is intersected by one of the slots has a first quantity of the fins and each row that is not intersected by one of the slots has a second quantity of the fins that is greater than the first quantity.

3. The electrical assembly of claim 1, wherein each of the fins has a first end which is fixedly coupled to the base, and a second end that is opposite the first end, and wherein each of the fins tapers between the first and second ends.

4. The electrical assembly of claim 1, wherein the fins in adjacent rows are staggered from one another.

5. The electrical assembly of claim 1, wherein the base tapers between the radially-inner side of the base and the radially-outer side of the base.

6. The electrical assembly of claim 5, wherein the radially-inner side of the base is thinner than the radially-outer side of the base.

7. The electrical assembly of claim 1, wherein the power semiconductor package comprises an insulated gate bipolar transistor (IGBT), a metal oxide silicon field effect transistor (MOSFET), or a junction field effect transistor (JFET).

8. The electrical assembly of claim 1, wherein the base and the one of the electric terminals are integrally and unitarily formed.

9. The electrical assembly of claim 1, wherein each heat sink is integrally and unitarily formed.

10. The electrical assembly of claim 1, wherein the heat sink and the one of the electric terminals are unitarily and integrally formed.

* * * * *